United States Patent
Chitayat

[19]

[11] Patent Number: 6,069,416
[45] Date of Patent: May 30, 2000

[54] TWO-AXIS MOTOR PLATEN AND METHOD FOR MAKING

[75] Inventor: Anwar Chitayat, Fort Salanga, N.Y.

[73] Assignee: Anorad Corporation, Milwaukee, Wis.

[21] Appl. No.: 08/669,611

[22] Filed: Jun. 24, 1996

[51] Int. Cl.$^7$ .................................................. H02K 41/00
[52] U.S. Cl. ............................................................... 310/12
[58] Field of Search ................................... ; H02K 41/00

[56] References Cited

U.S. PATENT DOCUMENTS

| | | | |
|---|---|---|---|
| 4,210,448 | 7/1980 | Forgo | 430/126 |
| 5,334,892 | 8/1994 | Chitayat | 310/12 |
| 5,371,598 | 12/1994 | Ghaem et al. | 356/373 |
| 5,521,831 | 5/1996 | May | 235/380 |
| 5,552,651 | 9/1996 | Radomski | 310/181 |

*Primary Examiner*—Nestor Ramirez
*Assistant Examiner*—Judson H. Jones
*Attorney, Agent, or Firm*—Himanshu S. Amin; John J. Horn; A.M. Gerasimow

[57] ABSTRACT

An X-Y traversing machine employs optical pickups on a stage that moves around a base on an air bearing. A pattern of dots on the surface of the base forms a scale. Respective X- and Y-direction optical pickups are used to detect incremental movement in X- and Y-directions independently. Each pickup averages the reflected light from an elongated rectilinear region whose long axis is aligned perpendicular to the direction of movement the pickup detects. The dots are formed on an encoder scale element. According to an embodiment of the invention, forces are developed without using serrations in the stage and magnets so that a substantial spacing between the coils and field generator (permanent magnets in the preferred embodiment) can be tolerated. This allows the encoder scale to be placed on or protected by a sheet between the platen and the stage. [For example, the pattern may be printed on a flexible transparent Mylar sheet that can be readily replaced if damaged. To form a complete motor platen, according to one embodiment of the motor platen, the outer surface of the grid scale element is laid over an element with a precise flat surface is provided with some means for pulling the grid scale flat to the flat surface. Magnets are arranged on the back of the scale element and epoxy applied around and between the magnets. A base plate is placed over the epoxy and held in place till the epoxy cures.]

64 Claims, 15 Drawing Sheets

TWO-AXIS MOTOR PLATEN AND METHOD FOR MAKING

BACKGROUND OF THE INVENTION

The present invention relates to devices known variously as traversing machines, positioning devices, actuators, etc. More particularly the invention relates to such devices with the ability to traverse along more than a single axis and that use optical encoder systems to determine position and orientation of the stage.

X-Y motors, with a stage supported by some means that permits movement along two perpendicular axes, are known. Displacement information, either incremental, as provided by optical encoders or interferometers, or absolute, as provided by resistance encoders, is required to position the stage in a desired location. One of the problems with using encoders, rather than, for example, interferometers, is the lack of resolution. Interferometers can resolve movement as small as a wave-length of the laser source. Encoders require a scale or scales with optically resolvable lines or hatching. It is difficult to make very fine lines over a large area to achieve a resolving power even remotely approaching that of an interferometer. Interferometers are expensive and limit the speed with which the traversing system can operate. Resolving power is always traded against cost in designing manufactured systems. It is a goal in this industry to achieve high resolving power of the positioning information with low cost and high speed. Any increase in the cost-effectiveness of high-resolution systems is highly desirable.

To use two linear scales, one for each axis of movement, a scale may be placed on the base and a corresponding optical pickup on the gantry. The other scale may be placed on the gantry and another optical pickup on the stage. This system may require greater stiffness and precise alignment of the gantry mechanism because of the distance between the encoder scale and the stage, assuming the encoder scale is mounted on the edge of the base. Another method of movement encoding is to use X- and Y-optical pickups moving over a grid of lines, instead of a linear series of lines.

Referring to FIG. 1 a traversing machine 1, according to the prior art, uses a single grid-scale 2. Traversing machine 1 includes a gantry 7 with track 7. Track 7 includes rails 8. Movable stage 6 has linear bearings 5 that couple movable stage 6 with rails 8 to permit movable stage 6 to ride along rails 8. Gantry 18 travels on rails 17 in a direction perpendicular to rails 8.

A cross-hatch pattern of lines 4, a respective set being parallel to the X-axis and a respective set being parallel the Y-axis, define a rectangular array of square patches 3, lines 4 are formed in a surface over which the stage flies. An X-direction optical pickup 5a detects light reflected from grid lines so as to be sensitive only to movement in the X-direction. A Y-direction optical pickup 5b detects light reflected from grid lines so as to be sensitive only to movement in the Y-direction.

Stage 6 moves in X and Y directions aligned with respective perpendicular edges of base 22. The means by which X-Y stage 6 moves relative to base 22 could be any of a number of different known mechanisms (not shown), such as an air bearing, a gantry mechanism mounted on linear bearings, etc. U.S. Pat. No. 5,334,892 describes a traversing system in which stage rests on air bearings that float on a magnet platen. Motor armatures on the stage generate changing magnetic fields that interact with fields generated by magnets in the magnet platen to create a motive force. In this case position and orientation information are supplied by interferometers that bounce laser beams off mirrors attached to the platen. Interferometer-based systems require expensive vibration isolation in order to work properly. In addition, interferometers are more expensive than optical pickups used in other types of traversing systems.

Problems with applying the encoder technology of traversing systems are numerous and varied. There is a pressing need to discriminate very fine degrees of movement. However, as is readily apparent, manufacturing a grid scale with very fine pitch is costly. Generally, such scales are made of a reflective material with machined or printed portions formed on their surfaces. Moreover, creating traversing machinery that provides optical pickups with access to a stationary grid scale without interference is another obstacle to design. Yet another problem is economically printing oil a large area to produce an accurate and consistent grid scale. Still another problem is the vulnerability of highly precise scales to incidental damage or occasional breakdown of the traversing system. Still another problem is cost-effective production of an entire motor platen, with a precise flat surface, especially one with a built-in optical scale.

OBJECTS AND SUMMARY OF THE INVENTION

An object of the present invention is to provide an encoder system for an X-Y traversing machine that is economical to make and maintain.

Another object of the present invention is to provide an accurate encoder system for an X-Y traversing machine.

Yet another object of the present invention is to provide a position detection device that is simple to manufacture.

Yet another object of the present invention is to provide a position detection device for an X-Y traversing machine.

Yet another object of the present invention is to provide a position detection device for a traversing machine that provides high spatial resolving power.

Yet another object of the present invention is to provide an encoder mechanism for a traversing machine with a grid scale that is accurate.

Yet another object of the present invention is to provide an encoder mechanism for a traversing machine with a grid scale that is capable of being replaced easily if damaged.

Briefly, an X-Y traversing machine employs optical pickups on a stage that moves around a base on an air bearing. A pattern of dots on the surface of the base forms a scale. Respective X- and Y-direction optical pickups are used to detect incremental movement in X- and Y-directions independently. Each pickup averages the reflected light from an elongated rectilinear region whose long axis is aligned perpendicular to the direction of movement the pickup detects. The dots are formed on an encoder scale element. According to an embodiment of the invention, forces are developed without using serrations in the stage and magnets so that a substantial spacing between the coils and field generator (permanent magnets in the preferred embodiment) can be tolerated. This allows the encoder scale to be placed on or protected by a sheet between the platen and the stage. For example, the pattern may be printed on a flexible transparent Mylar sheet that can be readily replaced if damaged. To form a complete motor platen, according to one embodiment of the motor platen, the outer surface of the grid scale element is laid over an element with a precise flat surface is provided with some means for pulling the grid scale flat to the flat surface. Magnets are arranged on the on the back of the scale element and epoxy applied around and between the magnets. A base plate is placed over the epoxy and held in place till the epoxy cures.

According to an embodiment of the present invention, there is provided, a positioning system, comprising: a generally planar base having a base surface, a generally planar cover element overlying the base surface and having a facing surface facing the base surface, the cover element having an exposed surface on an opposite side of the cover element from the facing surface, one of the base surface and the facing surface having regions of a first reflectivity with at least one region of second reflectivity therebetween, the cover element being generally transparent, whereby the regions of a first reflectivity are visible from the exposed surface, a stage movably connected to the base and the stage having at least one optical pickup oriented to detect a net reflectivity of an area of the one of the base surface and the facing surface.

According to another embodiment of the present invention, there is provided, a positioning system, comprising: a generally planar base having a base surface, the base having attached thereto a plurality of magnets forming an array adjacent the surface, a stage movably connected to the base, the stage having an electrical coil positioned sufficiently close to the base surface to generate a motive force by generating a field that interacts with a field generated by the plurality of magnets, the stage having first and second optical pickups, a planar cover element between the base and the stage, an array of regions having a first measurable optical characteristic surrounded by one or more regions having a second measurable optical characteristic on one of the base and the planar cover element, the first and second measurable optical characteristics being of a type that can be distinguished by the first and second optical pickups and the first and second optical pickups being positioned and oriented to detect the first and second measurable optical characteristics of respective areas of the one of the base and the planar cover element.

According to still another embodiment of the present invention, there is provided, a positioning system, comprising: a generally planar base having a base surface, the base having attached thereto a plurality of magnets forming an array adjacent the surface, a stage movably connected to the base, the stage having an electrical coil positioned sufficiently close to the base surface to generate a motive force by generating a field that interacts with a field generated by the plurality of magnets, the stage having first and second optical pickups, first and second planar cover elements between the base and the stage, the first planar cover element having, on a first surface thereof, an array of parallel first lines having a first measurable optical characteristic, the first measurable optical characteristic being different from a measurable optical characteristic of spaces between the first lines and the second planar cover element having, on a second surface thereof, an array of parallel second lines having a first measurable optical characteristic, the first measurable optical characteristic being different from a measurable optical characteristic of spaces between the second lines, the first and second measurable optical characteristics being of a type that can be distinguished by the first and second optical pickups and the first and second optical pickups being positioned and oriented to detect the first and second measurable optical characteristics of respective areas of the one of the base and the planar cover element, the first and second surfaces facing each other and the first lines being perpendicular to the second lines.

According to still another embodiment of the present invention, there is provided, a method of making a motor platen for a positioning system, comprising the steps of: forming a base with an array of magnets embedded therein, forming a first array of regions having a first optical property in the form of a first series of parallel lines on a first sheet of transparent material, forming a second array of second regions having a second optical property in the form of a second series of parallel lines on a second sheet of transparent material and laying the first sheet of transparent material on the base and affixing it thereto, arranging the second sheet so that the first series of parallel lines is perpendicular to the second and laying the second sheet on top of the first sheet.

According to still another embodiment of the present invention, there is provided, a method of making a motor platen for a positioning system, comprising the steps of: laying a generally planar 2-dimensional optical scale element on a flat surface, forcing the scale element against the flat surface, arranging magnets on the scale element, applying a curable resin to the magnets, laying a base over the curable resin and curing the curable resin.

According to still another embodiment of the present invention, there is provided, a method of making a motor platen for a positioning system, comprising the steps of: laying a generally planar 2-dimensional optical scale element on a flat surface, forcing the scale element against the flat surface, arranging magnets on the scale element, applying a curable resin to the magnets, laying a base over the curable resin and curing the curable resin, the step of arranging including placing standoffs on the scale element, the step of arranging including placing the magnets on the standoffs and the step of applying including injecting the resin into a space between the base and the scale element.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 1:
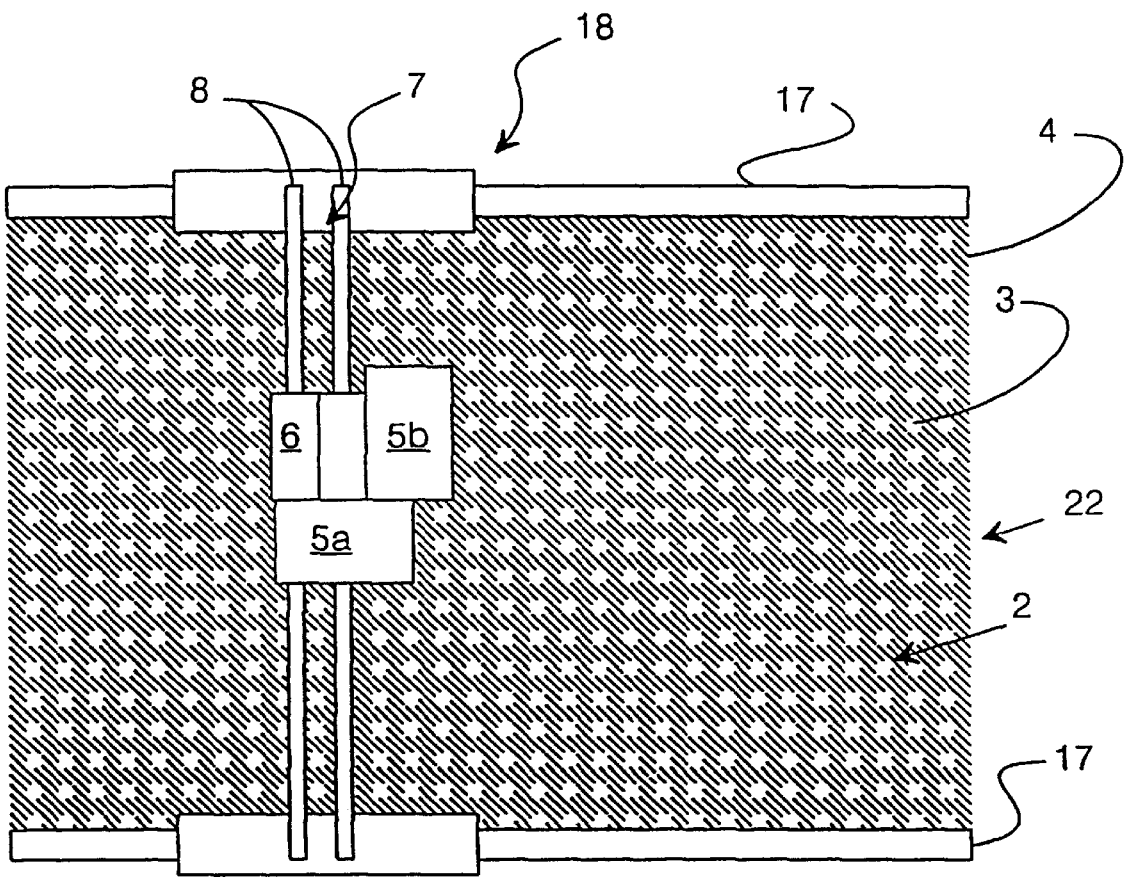
FIG. 1 is a plan view of a traversing system according to the prior art.
Figure 2A:
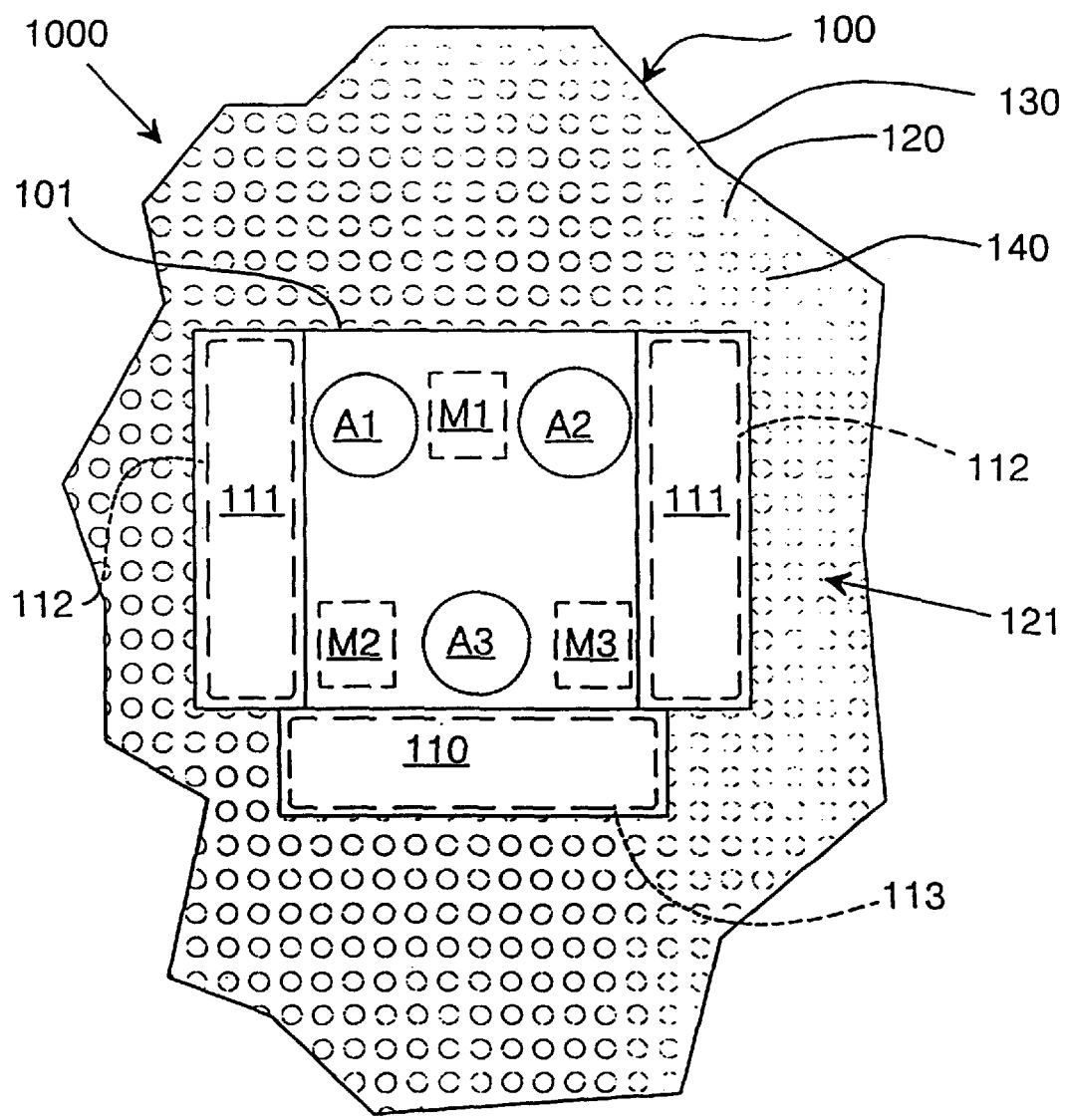
FIG. 2a is a plan view of an X-Y positioning system with a position and orientation-detecting apparatus according to an embodiment of the present invention.

Referring to FIG. 2a, an X-Y traversing system 1000 has a base 100, with a stage 101 supported on base 100 by one or more air bearings A1, A2, and A3. Stage 101 has a built-in motor (not shown) that orients and moves stage 101 with respect to base 100 as described in U.S. Pat. No. 5,334,892, the entirety of which is incorporated herein by reference. Base 1000 has an array of permanent magnets (not shown) with which motors M1, M2, and M3 in stage 101 interact to cause stage 101 to move about base 100 with a constant orientation of stage 101.

Figure 2B:
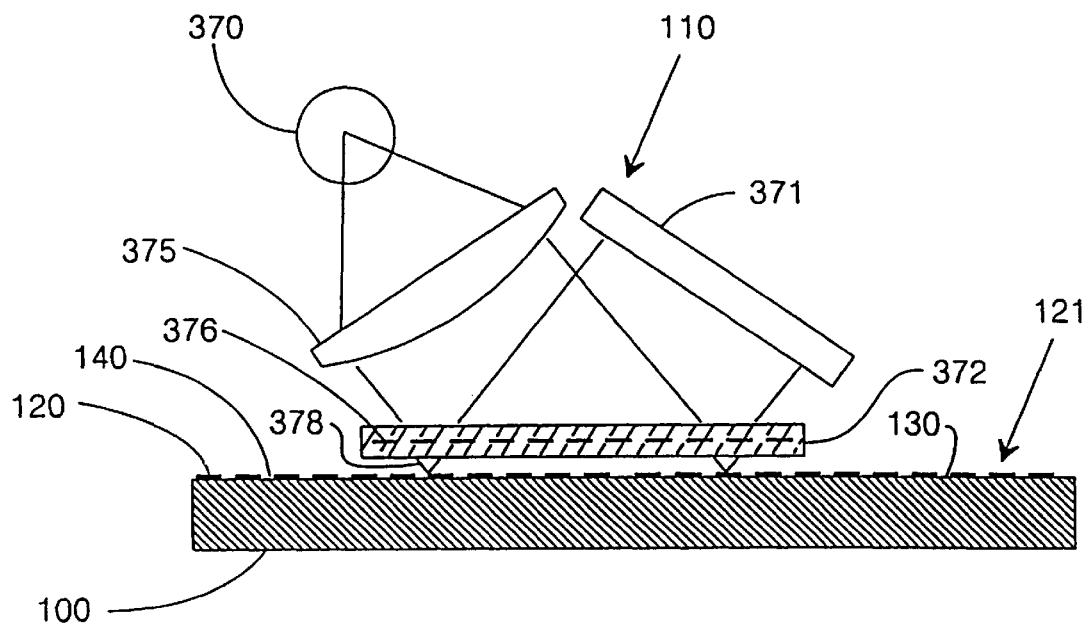
FIG. 2b is a side view of an optical pickup taken along a longitudinal axis.
Figure 2C:
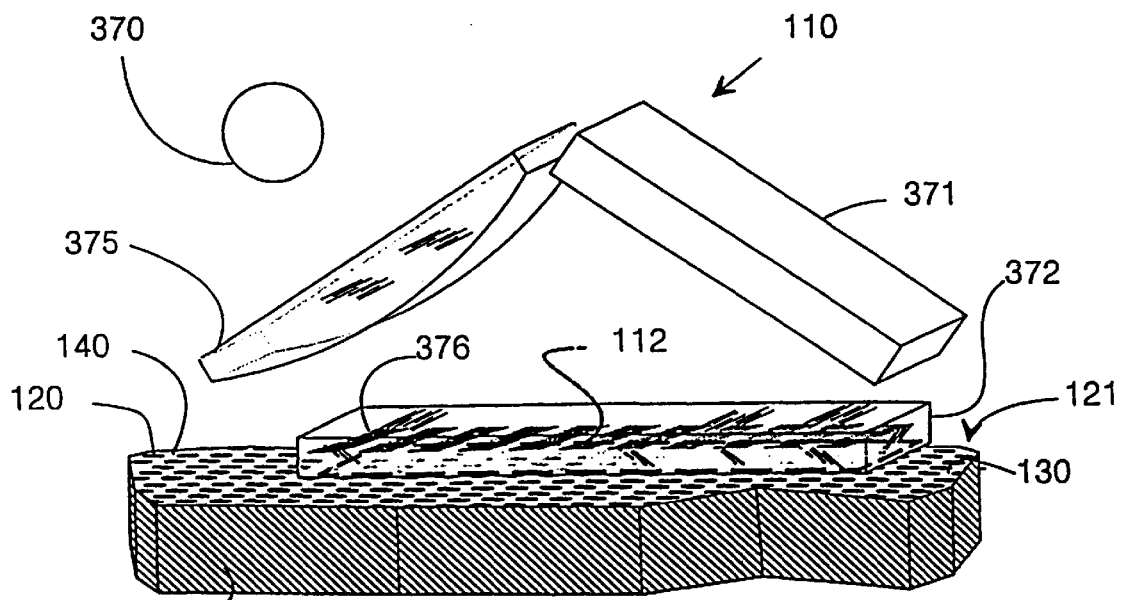
FIG. 2c is a perspective view of the optical pickup of FIG. 2b.

Referring now also to FIGS. 2b and 2c, in order to employ X-Y traversing system 1000 for precise positioning, it is necessary to detect two independent coordinates representing the position of stage 101 relative to base 100. An encoder system is employed to detect movement of stage 101 relative to base 100. The encoder system includes a grid encoder scale 121 with circular regions 120 of a surface 130 of base 100 whose reflectivity is much higher than intersticial area 140 separating regions 120. (alternatively, circular regions 120 can have a low reflectivity and intersticial area 140, a high reflectivity.) Circular regions 120 are of a highly reflective coating formed on surface 130 of base 100. An X-direction optical pickup 110 and a Y-direction optical pickup 111 (not shown in FIGS. 2a and 2b, but identical to X-direction optical pickup 110 as shown in FIGS. 2a and 2b) detect movement of stage 101 relative to base 100.

Note that the proportions of elements of X-Y traversing system 1000 shown in FIG. 2a are deliberately distorted for illustration purposes. For example, in a practical system, the relative sizes of air bearings A1, A2, and A3 would be chosen for proper balance and might not be the same as illustrated. Optical pickups 110 and 111 would probably be substantially smaller as would circular regions 120 (in fact the latter might not be visible with the naked eye). Also the sizes of motors M1–M3 would be chosen according to known design principles and each would not likely be the same size as shown. In addition, details of optical pickups 110 and 111 are not necessarily as shown in FIGS. 2a and 2b which was created for the purpose of providing a general explanation of how the encoder system works.

Each optical pickup 110, 111 projects light on its respective discrimination region 112, 113 and detects the light reflected therefrom. Light from a light source 370 is collimated by a condenser lens 375 and directed to a reticle 372. Reticle 372 has a series of mask regions 376 (usually a metalized coating over a substrate, where the metalized coating has been etched to define mask regions 376) comprising an index grating. The spacing of mask regions 376 is substantially equal to a spacing or pitch of circular regions 120. Reflected light passes through reticle 372 to encoder scale 121. Mask regions 376 create shadows in the light beam transmitted through reticle 372. When transmitted light beams 378 coincide with circular regions 120, they are substantially reflected since circular regions 120 are more reflective than intersticial area 140. When encoder 110 moves in the X-direction a distance equal to half the dot-pitch, the transmitted light beams 378 hit substantially only the intersticial area reducing the amount of light reflected. Reflected light passes back through the reticle and is detected by a photo-sensor 371. As X-direction optical pickup moves the reflected light cycles between maxima and minima (generating an electrical signal that is processed to determine cumulative movement. As can be seen by inspection, X-direction optical pickup is responsive essentially, only to movement in the X-direction since the light reflected by short columns of circular regions 120 spanning the width of reticle 372 is averaged. As can also be seen by inspection, Y-direction optical pickup 111, using the same construction as X-direction optical pickup 110, but aligned with the Y-direction instead of the X-direction, is responsive only to movement in the Y-direction. Instead of dots, grid scale 121 can be composed of a grid of overlapping lines defining squares (which correspond to circular regions 120) between them. In addition, it is not necessary that circular regions (or the squares, it overlapping lines are formed) have a higher reflectivity than intersticial region 140. The opposite may be true and the system works just as well.

In summary, optical pickups 110, 111 each employ a reticle with a grating whose spacing corresponds to the spacing of columns of and rows of circular regions of grid scale 121. Light produced by optical pickups 110, 111 passes through a respective reticle and reflects from circular regions 120. Because the spacing of the grating corresponds to the spacing between columns and rows of circular regions 120, the total amount of reflected light cycles as optical pickups 110, 111 move over grid scale 121. Photo sensors 371 produce a signal corresponding to the net reflected light which cycles for each increment of movement equal to the circular region spacing.

In a practical system, to sense direction of movement, optical pickups 110 and 111 could have multiple photo sensors 371 and the spacing of mask regions 376 would not be the same as the spacing of reflective regions 120A. A moving pattern (like a moire pattern) would be projected on the multiple photo sensors and the direction of movement thus determined. Note that the proportions of elements of optical pickups 110 and 111 have been distorted for explanation purposes. In a real device, the density of reflective regions 120 and the mask regions 376 in the reticle would probably be much higher. In addition, the spacing, thickness, and lens power of the elements is not intended to be accurately represented by FIGS. 2a and 2b.

Circular regions 120 are arranged in a regular pattern with constant spacing between adjacent columns and rows of circular regions 120. Note, however, that if the resolution required for one axis is lower than that required for the other axis, the spacing between rows need not be the same as the spacing between columns.

Figure 8A:
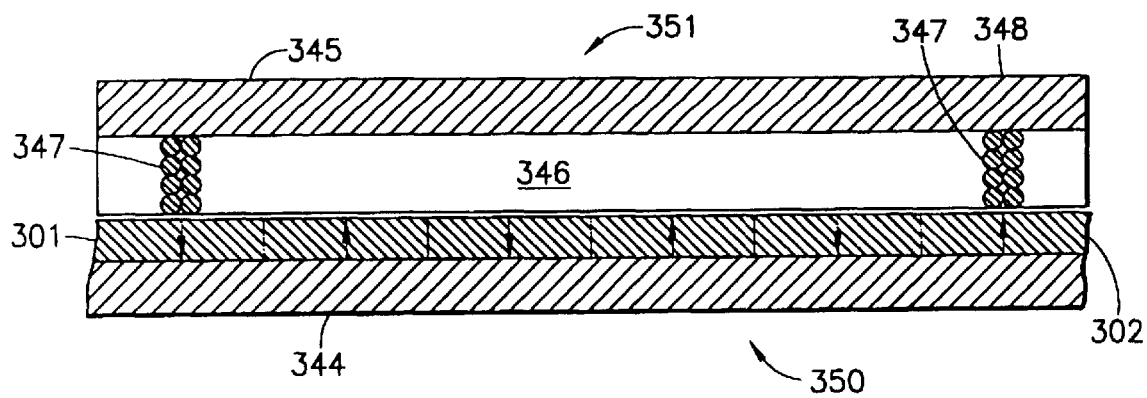
FIG. 8a is section view of an armature coil, without a high permeability core, and a magnetic platen, the section being taken along a longitudinal axis of one of the coils.

According to a preferred embodiment of the invention, the distance between the motor coils and permanent magnets is increased from the usual spacing of a few thousands of an inch (required in stepper motors that employ serrations using the so-called "Sawyer principle") to spacings oil the order of 0.05 inch. Motor coils (also known as "armatures") can have high-permeability cores or no cores at all, the coils being embedded only in epoxy or some other non-magnetic insulator. Where high permeability material is used for a core, the material is usually laminated to minimize eddy current generation. The configuration of these motors, the armatures and the magnetic platen with which they cooperate, are described further below with reference to FIGS. 8a and 8b. For now, please not that this configuration, and others, permit the spacing between the coils and motor platen to be large enough to accommodate a layer of material with encoder scale 121 formed thereon. This layer can be a separate element (for example, as discussed with reference to FIG. 3, a mylar sheet 140 imprinted with circular regions 120), which offers several advantages that are discussed below.

Figure 3:
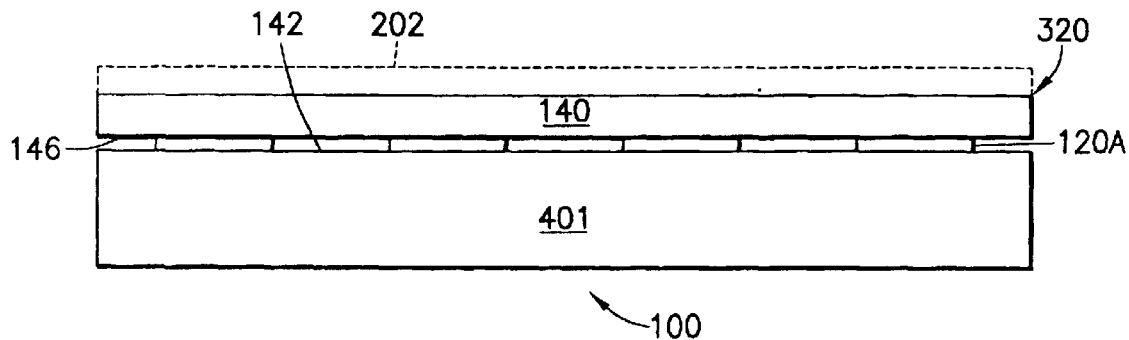
FIG. 3 is a side view of a base of the X-Y positioning system of FIG. 2a according to an embodiment of the invention.

Referring to FIG. 3, circular regions 120A (exaggerated in size and proportion for clarity) are imprinted on a mylar sheet 140 adjacent to a surface 142 of a base plate 401 of base 100 to form an encoder plate 320. Base plate 401 contains an array of permanent magnets as described above with reference to FIG. 2a. In this embodiment, the imprinted surface 146 of mylar sheet 140 faces surface 142 of base plate 401. Mylar sheet 140 is clear to allow optical pickups 110, 111 to detect circular regions 120A. An optional cover layer 202 or sheet of clear film (such as mylar) may be employed to protect mylar sheet 140, which has circular regions 120A imprinted on it. By using printing or etching technology to imprint on mylar sheeting rather than machining or imprinting on the surface of base 100 (a three-dimensional object) directly, great cost effectiveness may be achieved. In addition, should mylar sheet 140 become damaged (for example, due to failure of the air bearings supporting stage 101) mylar sheet 140 or cover layer 202 can be readily replaced.

Circular regions 120A may be imprinted on mylar sheet 140 using known dot-printing technology ordinarily employed for printing. Such technology is well known for printing on surfaces of various materials and is capable of high accuracy and high resolution. In addition to the laser or LED (light emitting diode) technology used to produce a latent image that is developed with toner, mylar sheet can also be metalized and chemically etched. For example, mylar sheet 140 can be coated with a metal layer on which is deposited a photo-resist material which is chemically altered by light. After a latent light image is impressed on the photo-resist, the differing properties of the exposed and non-exposed photo-resist permit only a portion of the photo-resist to be removed and the metal chemically etched only where photo-resist has been removed using known chemical etching techniques.

Figure 4:
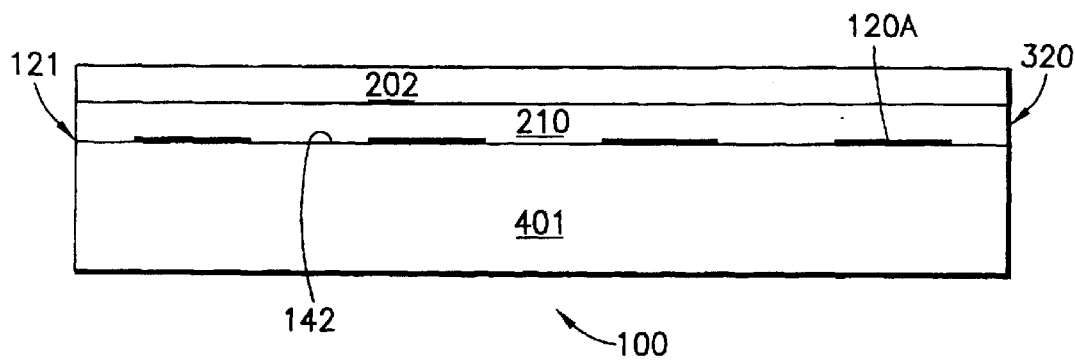
FIG. 4 is a side view of the base of the X-Y positioning system of FIG. 2a according to another embodiment of the invention.

Referring to FIG. 4, in another embodiment of encoder plate 320, circular regions 120A, constituting grid encoder scale 121 are formed (by machining, chemical etching, printing, or some other means) directly on surface 142 of base plate 401. Protective transparent sheet 210 is laid over surface 142 to protect grid encoder scale 121. Optionally a cover layer 202 can be laid over protective transparent sheet 210 to protect it. If the air bearings ever failed, protective transparent protective sheet 211 and/or cover layer 202 protects surface 142 and grid encoder scale 121. Cover layer 202. made of glass, plastic, mylar, and protective transparent sheet 210, can then be replaced.

Figure 5:
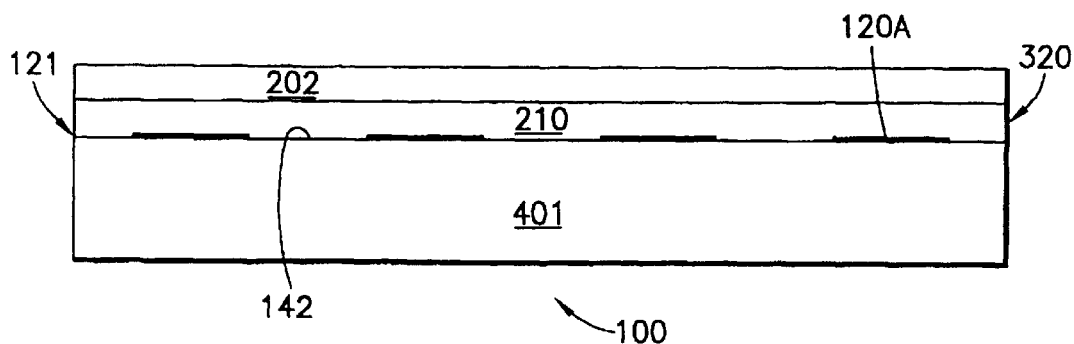
FIG. 5 is a side view of the base of the X-Y positioning system of FIG. 2a according to still another embodiment of the invention.

Referring to FIG. 5, in still another embodiment of base 100 and encoder plate 320, circular regions 120A, constituting grid encoder scale 121, are formed (by chemical etching, machining, printing, or some other means) on the lower surface of glass sheet 210. Cover layer 202 of mylar or glass should be used to protect glass sheet 210 with grid encoder scale 121 to preserve its clarity.

Figure 6:
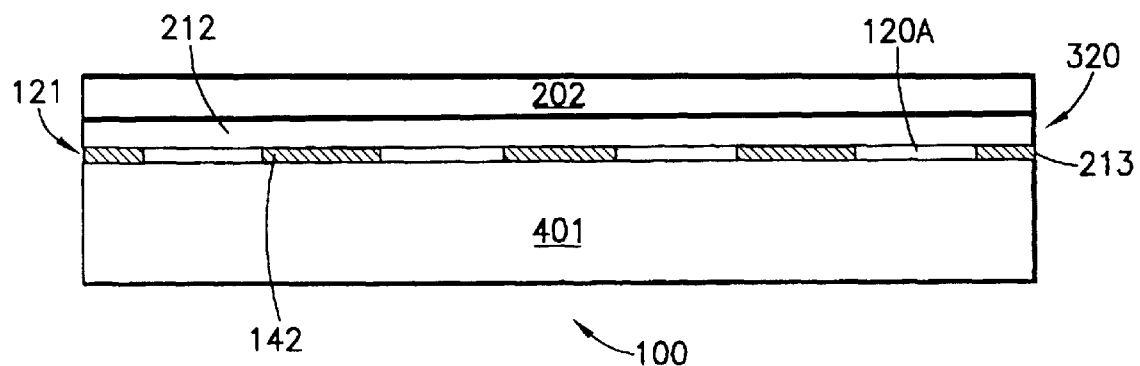
FIG. 6 is a side view of the base of the X-Y positioning system of FIG. 2a according to still another embodiment of the invention.

Referring to FIG. 6, in still another embodiment of encoder plate 320. circular regions 120A, constituting grid encoder scale 121, arc formed on the lower surface of mylar sheet 212. Mylar sheet 212 has a metalized coating 213 that has been etched to form circular regions 120A. Cover layer 202 of mylar or glass should be used to cover mylar sheet 212 with grid encoder scale 121. However, since mylar sheet 212 can be produced in continuous quantities (metal-coated with grid encoder scale 121 etched thereon), cover layer 202 may not be necessary because of the relatively low cost of replacing 212, which may be laid over surface 142 of base plate 401 and adhered by static charge, vacuum, gravity, or clamping at its edges. Note that irregularities in the orientation of mylar sheet 212 do not present a problem since the data processing used for position/movement detection can compensate for such irregularities according to known data filtering techniques.

Figure 7A:
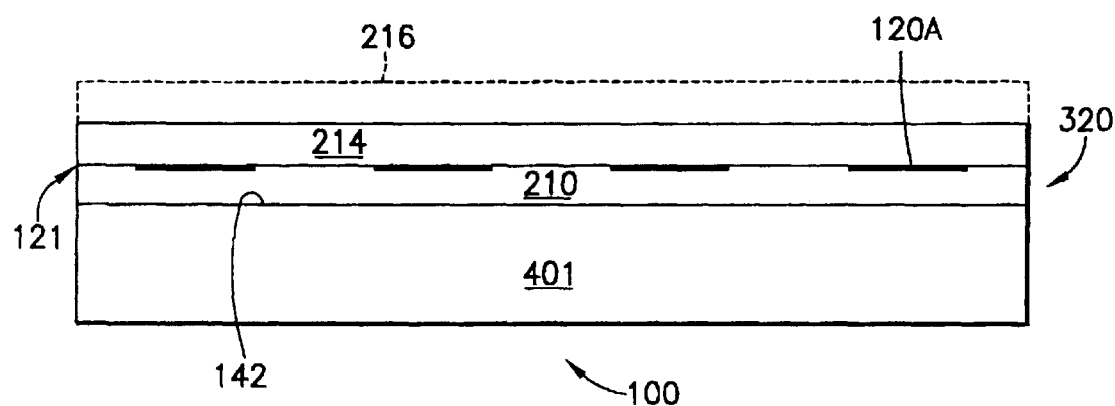
FIGS. 7a–7d are side views of the base of the X-Y positioning system of FIG. 2a according to other embodiments of the invention.

Referring to FIG. 7a, in still another embodiment of encoder plate 320 circular regions 120A, constituting grid encoder scale 121, are formed (by chemical etching, machining, printing, or some other means) on the upper surface of glass sheet 210. A protective sheet of mylar or glass 214 is used to cover glass sheet 210 with grid encoder scale 121. Optionally, cover glass or mylar sheet 214 can be overlaid with another cover glass or mylar sheet 216 to protect cover glass or mylar sheet 214. Cover glass or mylar sheet 216 preserves the transparency of cover glass or mylar sheet 214.

Figure 7B:
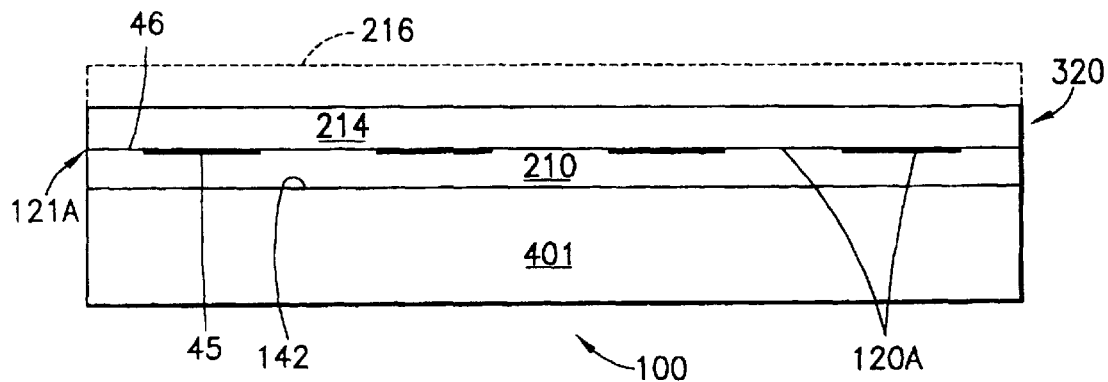
Figure 7C:
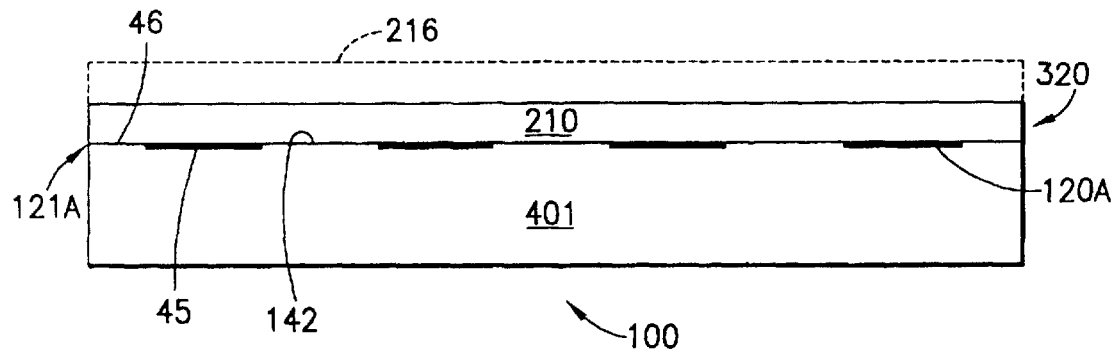
Figure 7D:
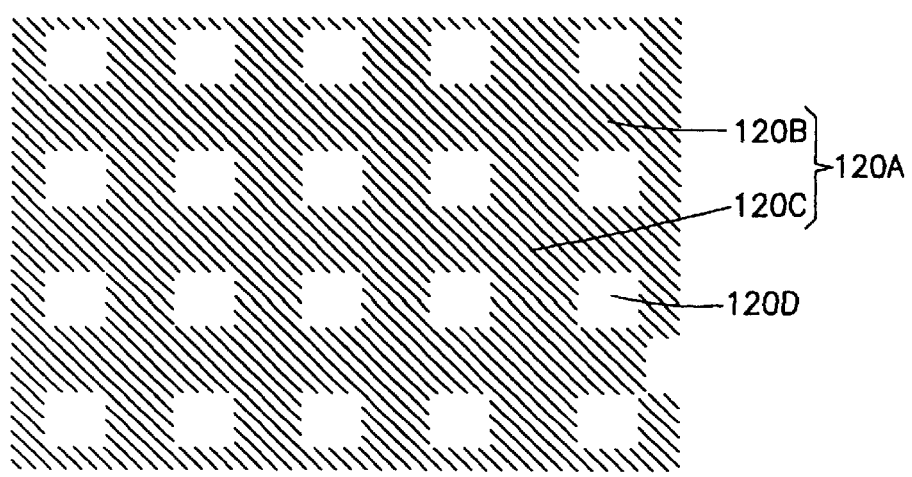

Referring to FIGS. 7b and 7d, in still another embodiment of encoder plate 320 hatch line regions 120A, constituting grid encoder scale 121A, are formed (by chemical etching, machining, printing, or some other means) on the upper surface of glass sheet 210, latch line regions 120A including horizontal line regions 120B and vertical line regions 120C, define a plurality of square regions 120D between them. Square regions 120D function similarly to circular regions 120A. A protective sheet of mylar or glass 214 is used to cover glass sheet 210 with grid encoder scale 121A. Optionally, cover glass or mylar sheet 214 can be overlaid with another cover glass or mylar sheet 216 to protect cover glass or mylar sheet 214. Cover glass or mylar sheet 216 preserves the transparency of cover glass or mylar sheet 214.

Referring to FIGS. 7c and 7d, in still another embodiment of encoder plate 320 hatch line regions 120A, constituting grid encoder scale 121A, are formed (by chemical etchings machining, printing or some other means) on the upper surface of base plate 401. Hatch line regions 120A, including horizontal line regions 120B and vertical line regions 120, define a plurality of square regions 120D between them. A protective sheet of mylar or glass 214 is used to cover g(lass sheet 210 with grid encoder scale 121A. Glass sheet 210 covers grid encoder scale 121A. Optionally, glass sheet 210 can be overlaid with another cover glass or mylar sheet 216 to protect cover glass or mylar sheet 214. Cover glass or mylar sheet 216 preserves the transparency of cover glass or mylar sheet 210. Note that glass sheet 210 could be replaced by a mylar sheet or some other transparent sheet material. Also, in the FIG. 7c embodiment, grid encoder scale 121 could be formed on glass (or mylar) sheet 210 instead of base plate 401. Another alternative is to form horizontal line regions 120B on one layer (for example glass sheet 210) and vertical line regions 120C on another layer (for example base plate 401). This can make for easier manufacturing of hatch line regions 120A.

Figure 9:
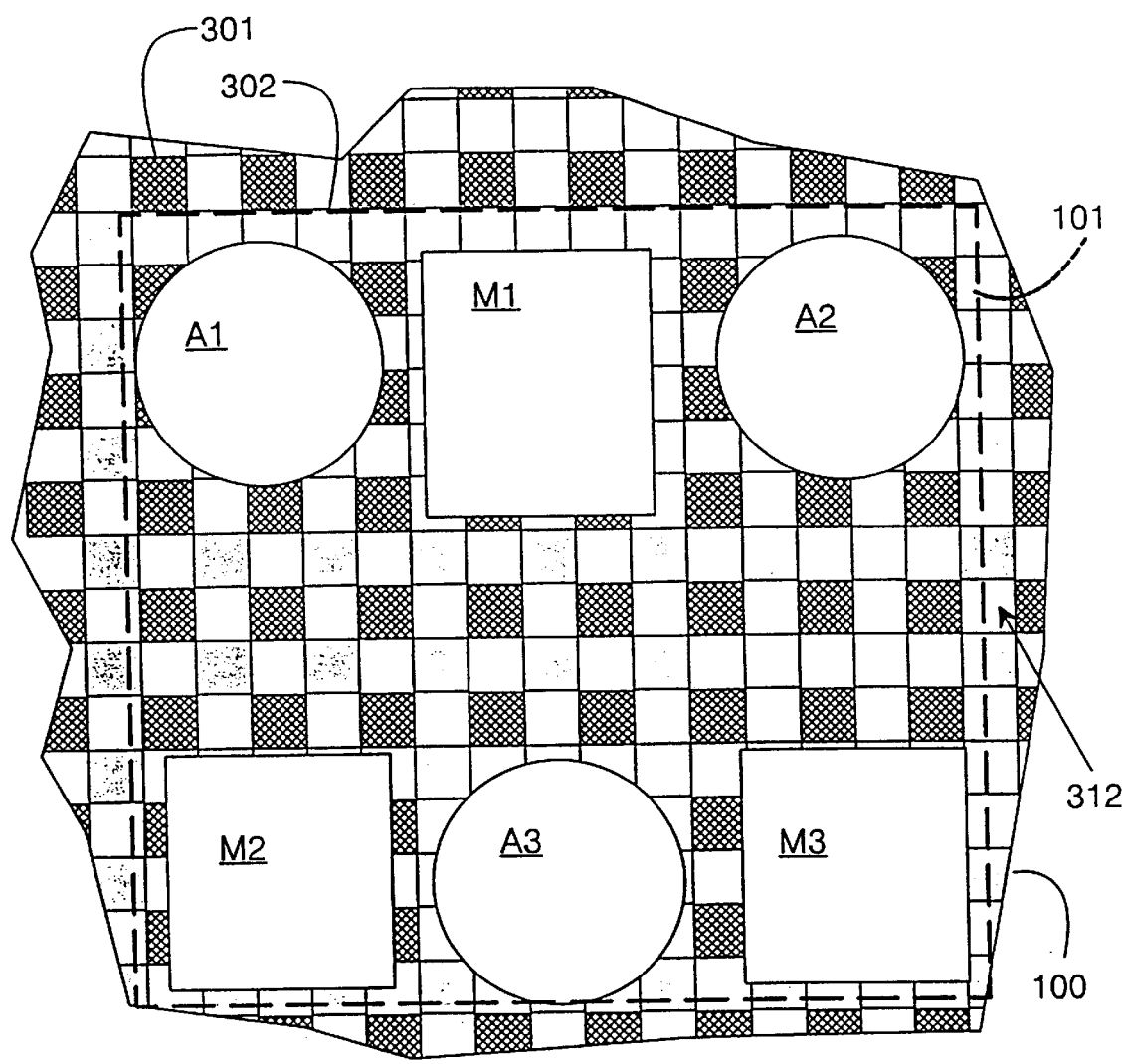
FIG. 9 is a plan view of the base showing the permanent magnets, and schematically indicating the motors and air bearings that support the stage above the base.

Referring to FIG. 9, a known X-Y traversing system orients and moves stage 101 with respect to base 100. Base 100 has an array of permanent magnets 312. North-facing permanent magnets 301 are oriented with their north poles facing stage 101. South-facing permanent magnets 302 are oriented with their south poles facing stage 101. Stage 101 moves with respect to base 100 by generating moving magnetic fields that interact with the fields of array of permanent magnets 312. Y-direction coils (not shown) in motors M2 and M3 are oriented with their longitudinal axes aligned with the X-direction. X-direction coils (not shown) in motor M1 are oriented with their longitudinal axes aligned with the Y-direction. Thus, each coil 535, 536 is arranged to interact with a section of columns or rows of permanent magnets 301, 302 and thereby produce a motive force in a respective one of the X- and Y-directions according to known principles. Two Y-direction motors M2 and M3 permit the generation of a moment about a z-axis perpendicular to the surface of base 100 to allow stage 101 to be continually reoriented with respect to base 100 so that stage 101 does not yaw.

Encoder plate 320, configured according to any of various embodiments described above, is laid adjacent base 100. A differential signal derived from the two Y-axis optical pickups 111 is used to maintain orientation of stage 101 with respect to base 100.

Stage 101 (not shown in FIG. 9) rests on a air bearings A1, A2, and A3. The triangular arrangement of air bearings A1, A2, and A3 provides stable support for stage 101.

Figure 8B:
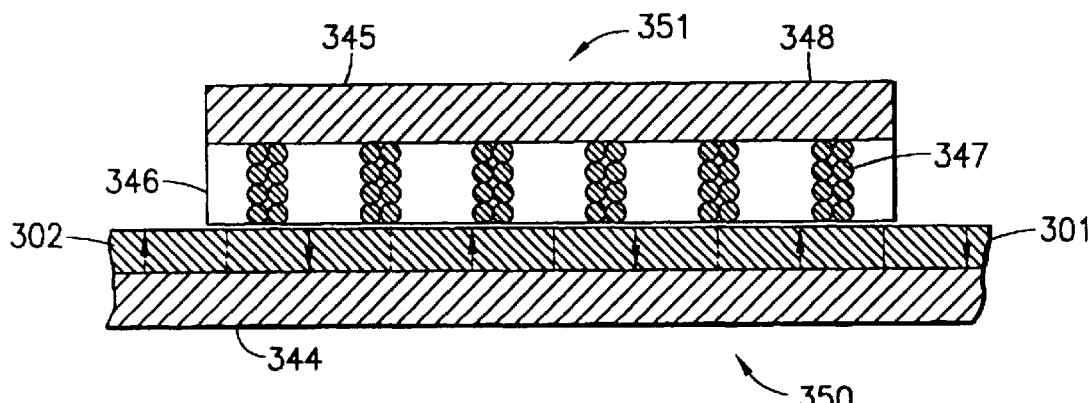
FIG. 8b is section view of an armature a coil, without a high permeability core, and the magnetic platen, the section being taken across the longitudinal axes of the coils.
Figure 8C:
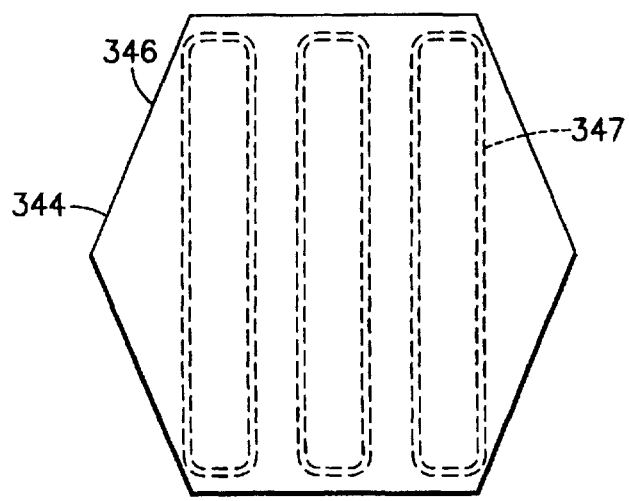
FIG. 8c is a top view of a coreless, low-cogging, armature for an X-Y motor according to an embodiment of the invention.

Referring to FIGS. 8b and 8c, a thin coreless type of armature employs motor coils 347 embedded in an epoxy resin bed 346. No high-permeability material is used inside motor coils 347. Epoxy resin bed 346 is attached to a high permeability back plate 345. A motor platen 350 has an array of magnets 301 and 302 and backed by another high permeability plate 344. High permeability plates 345 and 344 are preferably of steel for cost-effectiveness and strength, but can be made with other materials. High permeability plates 345 and 344 should have a high permeability such as materials typically employed in armatures with cores, The presence of high permeability plates 345 and 344 helps to close the magnetic circuits shown by lines 348. Without magnetic (high permeability) materials immediately adjacent permanent magnets 301 and 302, as in iron core armatures, cogging is drastically reduced. Further reduction in cogging can be achieved by shaping edges of armature back plate 345 as shown in FIG. 8c. The detailed dimensions of hexagon-shaped back plate 345 are not given as they call be numerically and experimentally optimized according to known techniques, the optimum dimensions varying at least with magnet size and spacing. The forgiving spacing between magnetic platen 350 and armature 351 allowed by employing motor coils encased in epoxy-only, rather than using high permeability materials, such as steel, is enhanced by using relatively thick magnets, on the order of 0.3–0.6 inch. Neodymium-iron magnets are preferred with this type of motor configuration. The greater spacing between the magnets and armature windings (motor coils) allows layers of material, at least one with encoder scale 121 (121A) etched or printed thereon can be laid over base 100.

Another alternative for the armature construction is to use pressed powder materials. Pressed metal powder elements are made of finely divided metal mixed with an insulative binder. The material is heated and compressed to form a high-density, high strength material that can be formed readily into an armature for an X-Y motor. The resulting armature's ability to reduce eddy currents, unlike that for laminations, is isotropic. That is, since in such material, eddy currents are confined to the small regions defined by the metal particles encapsulated in binder material and the dimensions of such particles are statistically the same regardless of orientation, it does not matter what the orientation of the permanent magnet fields relative to the armature and its direction of movement. Eddy currents generated by movement in nearly all axial directions are suppressed equally. This has important ramifications for an X-Y motor, such as in the present invention. While it is possible to arrange the laminations in a rotary or single-axis motor such that eddy currents will be strongly suppressed during movement, in a two-axis motor, laminations cannot be oriented to strongly suppress eddy currents in both X and Y-oriented armatures for both directions of movement. However, the pressed metal powder material suppresses eddy currents irrespective of the direction of movement. Such materials are commercially available.

Figure 10A:
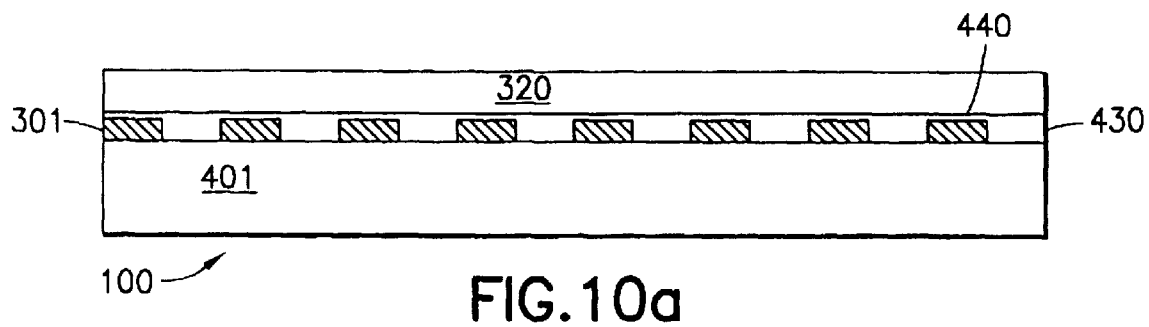
FIGS. 10a and 10b are section and plan views of the base showing the permanent magnets.
Figure 10B:
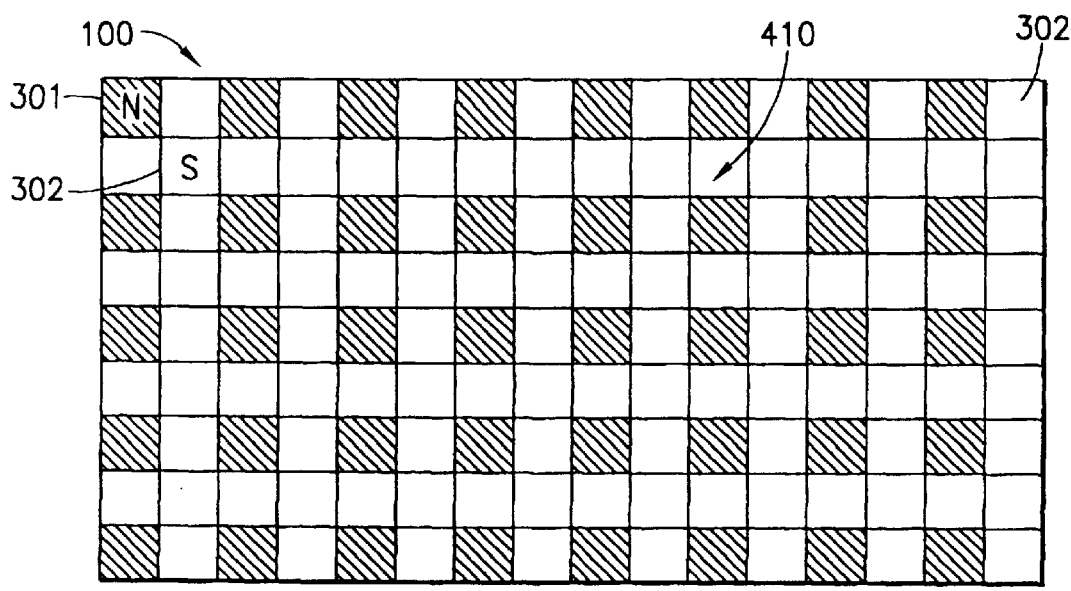

Referring now also to FIGS. 10a and 10b, to form base 100, a base plate 401, which must be flat, but not necessarily as flat as required for the air bearing surface, is covered with a rectangular array of permanent magnets 410. The spaces between, and overlying, permanent magnets 410 are filled with epoxy 430 to completely cover permanent magnets 410 and base plate 400. To form a smooth flat surface, a surface 440 of epoxy 430, once epoxy 430 has been cured, is precision ground so that when encoder plate 320 is laid on top, a flat surface is presented. Of course, this assumes that surface irregularities will not be generated by variations in the thickness of the materials making up encoder plate 320.

Figure 11:
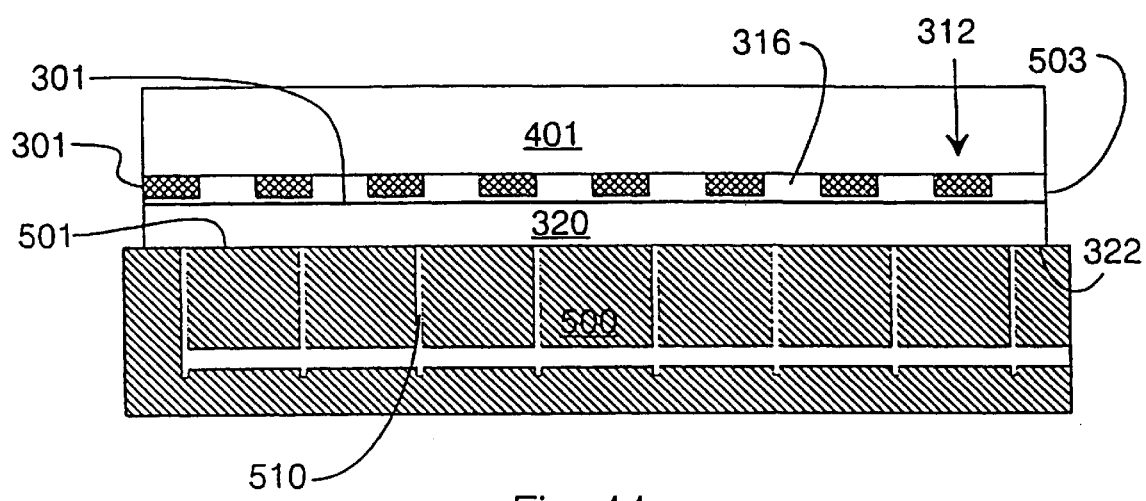
FIG. 11 is a section view of an assembly for making the base with the encoder plate.

Referring to FIG. 11, an alternative way of making base 100 compensates for such thickness variations in, for example, plate glass, used in the encoder plate embodiments described above. First, an optical flat 500 is provided which has as flat a surface as desired for the air bearing surface. Optical flat 500 is supplied with holes 510 which are connected to a vacuum supply 520 so that a vacuum can be pulled between a surface 501 of optical flat 500 and any object laid on top of it. Next, encoder plate 320, with grid encoder scale 121 facing surface 501, is laid on top of optical flat 500. A vacuum is then pulled. Preferably, the vacuum should be strong enough to cause the encoder plate 320 to flatten against the surface of optical flat 500 so that the surface of encoder plate 320 presenting grid encoder scale 121 is pulled completely flat (that is, there are no spaces between surface 501 of optical flat 500 and encoder plate 320). Once encoder plate is drawn flat. permanent magnets 301 (permanent magnets 302 are present also but not shown in the section of FIG. 11) are arranged on a back surface 322 of encoder plate 320 to form array of permanent magnets 312. Standoffs can be used to separate permanent magnets 301, 302 from the immediately-adjacent layer be it glass or whatever to allow epoxy to flow into the space between that layer and the magnets. The entire surface is then covered with epoxy 316 to fill the spaces between permanent magnets 301 and to cover the tops of permanent magnets 301. Before epoxy 316 is hardened, base plate 400 is laid on top of epoxy 316. After epoxy 316 hardens, the vacuum is removed and base 100 is completed.

One advantage of using mylar as the outer protective sheet is that if a flat encoder plate is formed using the above method, the thickness irregularities introduced in the outermost cover sheet layer will not be as great as if plate glass is used as a protective cover.

Figures 12A, 12B, 12C:
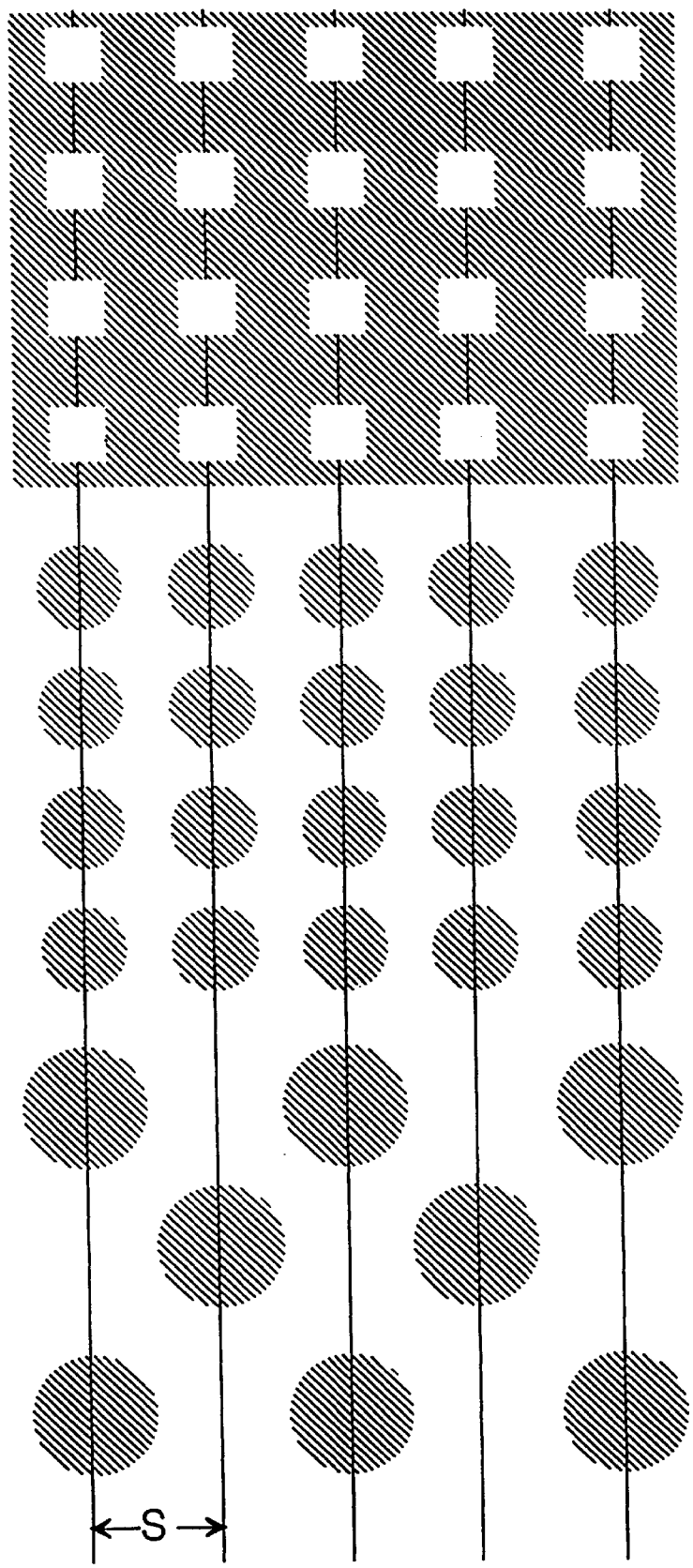
FIGS. 12a, 12b, and 12c are plan views comparing three different arrangements of reflective and non-reflective regions to form grid encoder scales according to respective embodiments of the invention.

Referring now to FIG. 12*a*, 12*b*, and 12*c*, there are various ways to form the regions with different reflective properties that form grid encoder scale 121. To obtain a scale for which the distance per cycle (cycle-pitch) of the signal from each optical pickup 110, 111 is S (signal's cycle-pitch=S). vertical and horizontal lines can be etched or printed on surface 130, glass sheet 210, etc, to form squares S/2 by S/2 in size. An improvement to rectangular pattern of squares can be obtained by forming dots instead of squares, which permits the maximum dimension of the regions to be increased from S/2 by S/2 squares to 0.707S diameter circles (FIG. 12*b*). The diameter of the circles can be increased even more if they are laid out in a 45-degree diagonal array (FIG. 2*c*), in which case, the circles can have a diameter of S for the same signal cycle-pitch. Because of the larger region size relative to the signal's cycle-pitch, the embodiments of FIGS. 12*b* and 12*c* permit a finer-resolution scale to be manufactured with technology capable of discriminating regions with a given resolution. That is, if a given printing technology is capable of printing regions with a minimum size of S, then the resolution of the resulting scale using a 45° array of circular regions will be twice that of a rectangular pattern of vertical and horizontal lines.

Figure 13A:
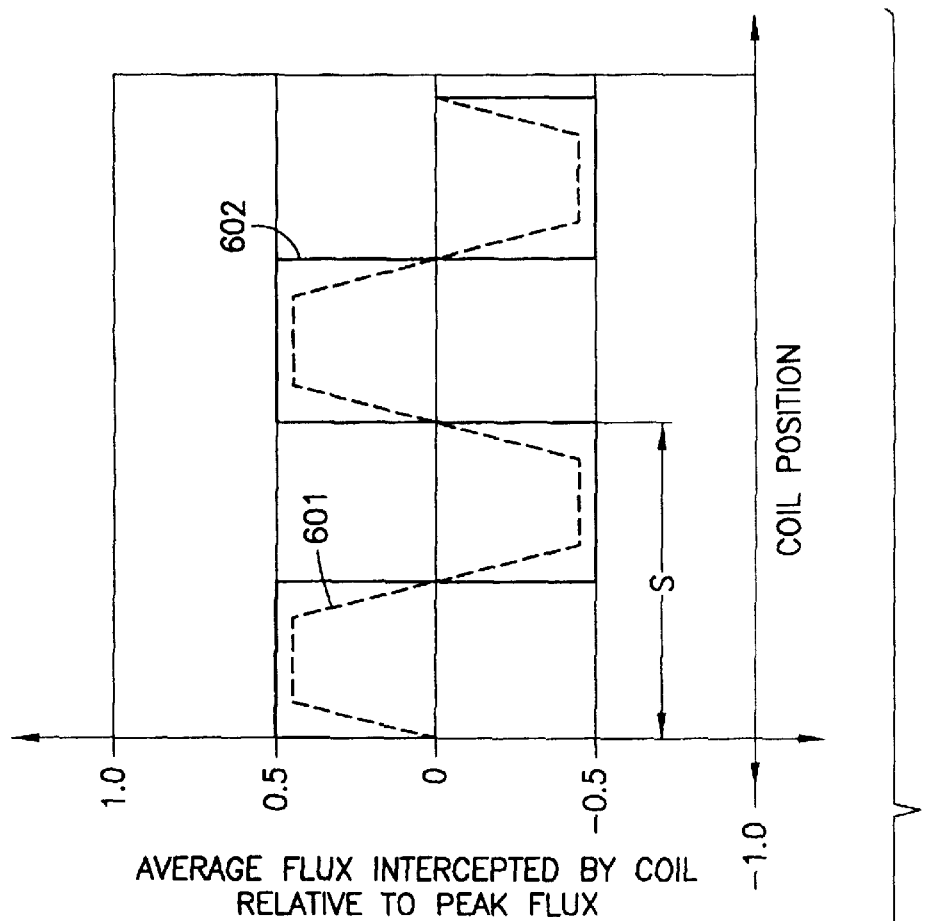
FIGS. 13a, 13b, and 13c are plan views of permanent magnet shapes/arrangements to produce the stationary field with which the motor in the stage interacts to provide motive force to move the stage with respect to the base.
Figure 13A:
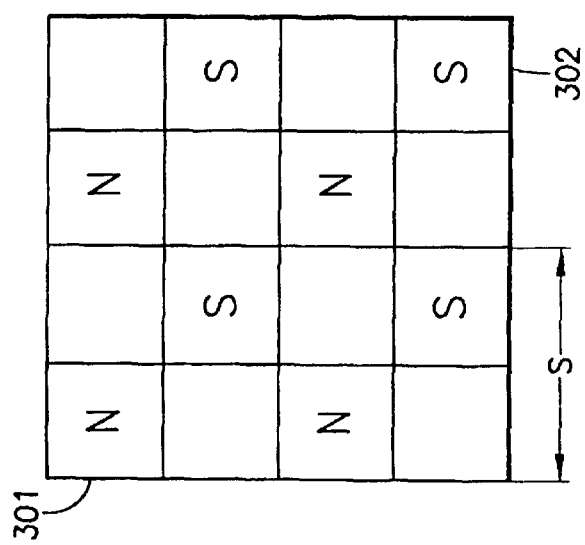
Figure 13B:
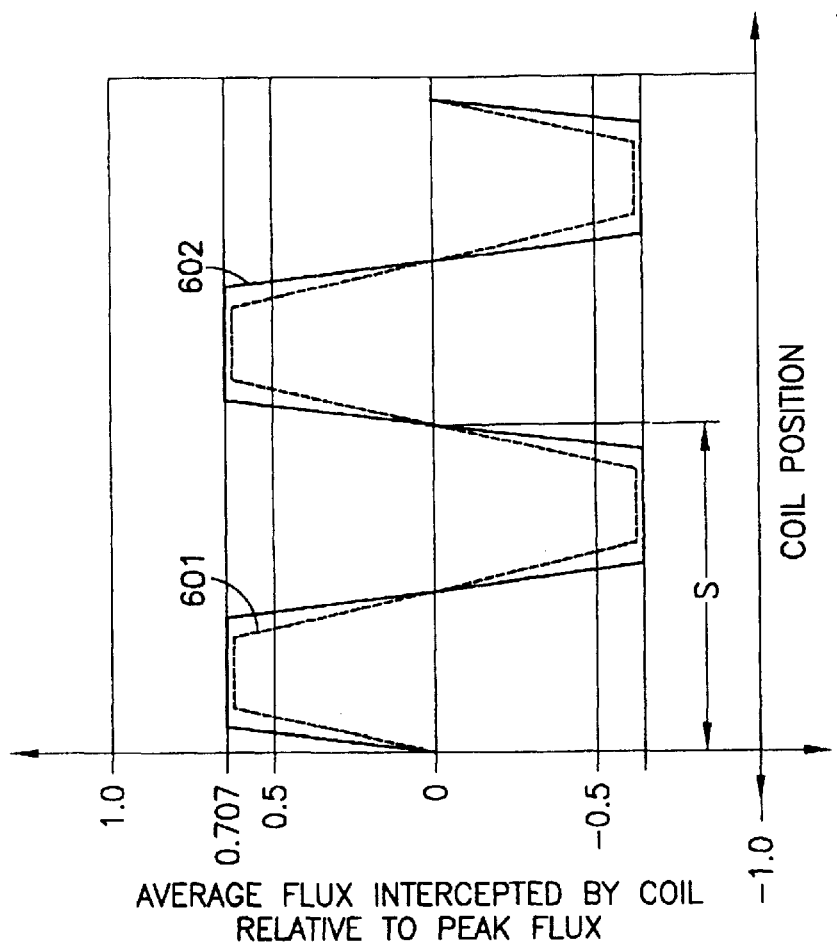
Figure 13B:
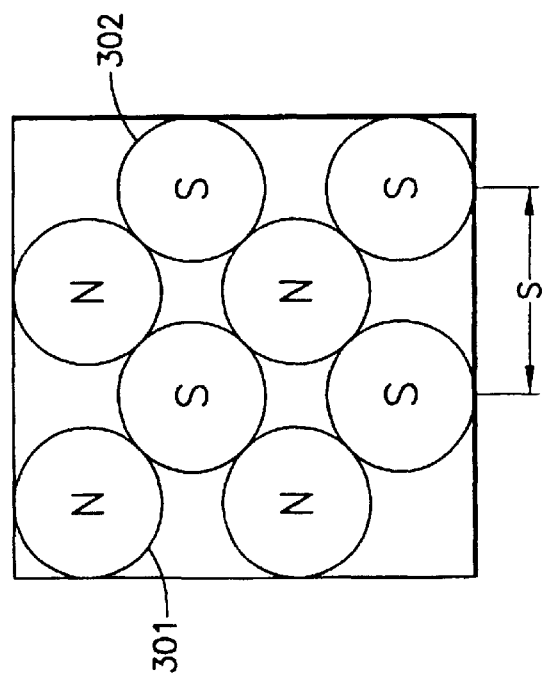
Figure 13C:
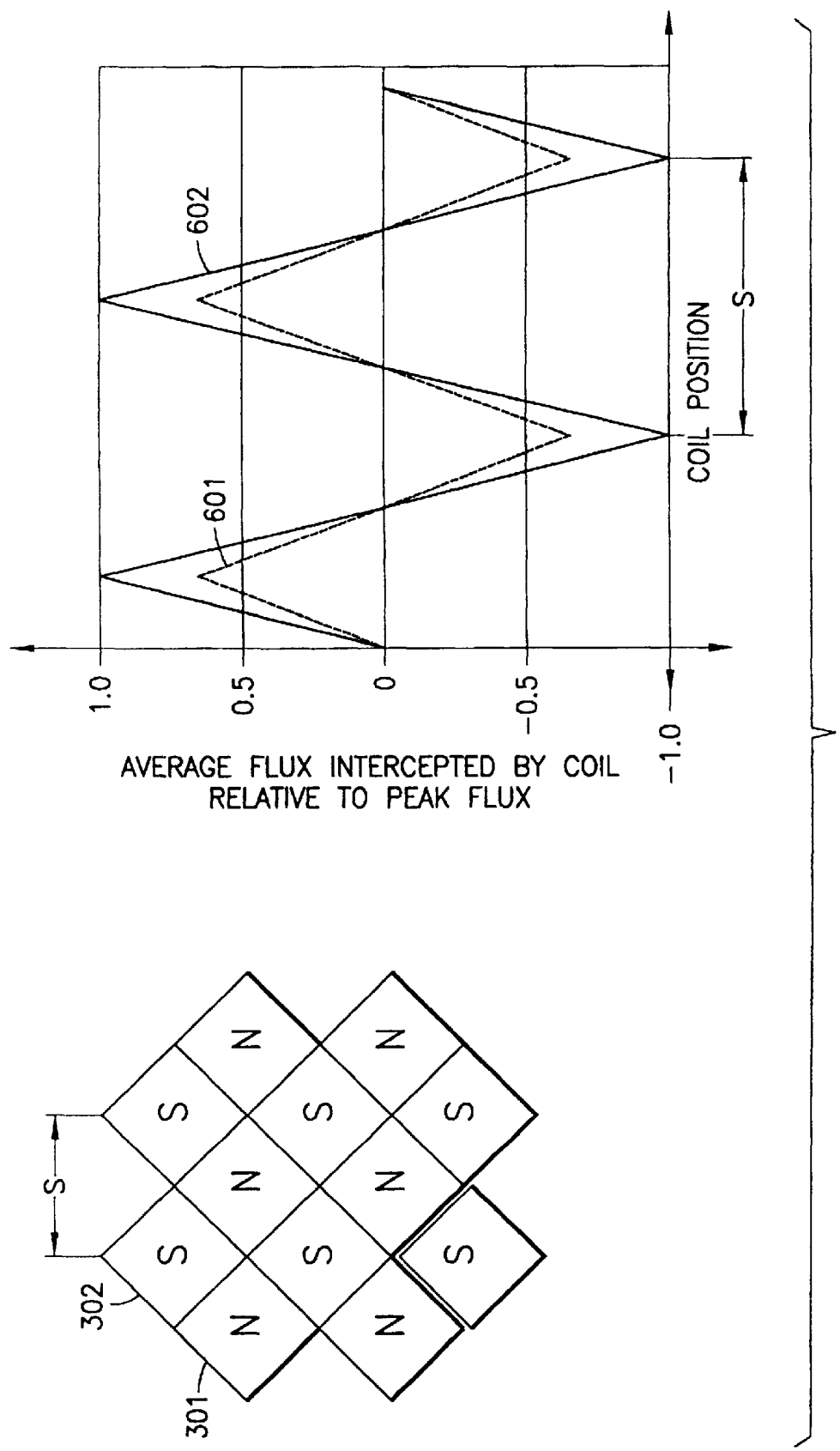

Referring to FIGS. 13*a*, 13*b*, and 13*c*, permanent magnets 301 and 302 are traditionally arranged in a rectangular array as shown in FIG. 13*a*. As noted above, motors M1–M3 contain X-direction and Y-direction coils, each of which subtends a longitudinal region (typically the region's width is about ¼ the spacing of like-oriented poles, S). When the coil is aligned with the center of a column of like-oriented poles, the average flux intercepted by the coil is at a maximum. However, the flux is averaged for all permanent magnets 301, 302 in a column so that the average peak flux intercepted by one motor coil is half the peak flux of permanent magnet 301, 302 alone.

According to one embodiment of the present invention, round magnets are used instead of square ones. The round magnets are arranged as shown in FIG. 13*b* so that their diameters can be as much as the length of the diagonals of the squares of the arrangement of FIG. 13*a*. It the circles are close-packed, as shown in FIG. 13*b*, the ratio of average peak flux to peak flux for magnet 301, 302 is increased, over the arrangement of FIG. 13*a*, from 0.5 to 0.707 for a hypothetical infinitely narrow coil or a single wire. The arrangement of FIG. 13*b* has the additional advantage of reduced cogging. Measured cogging for the round-magnet close-packed array shown in FIG. 13*b*, with S=1.2 inch is 0.9# versus 3# for the configuration of FIG. 13*a*.

According to another embodiment of the invention, a diamond array as shown in FIG, 13*c* is used. In this configuration, there is no space between any magnets so the packing density is 100%. The ratio of average peak flux to peak flux for magnet 301, 302 approaches 1.0 for a single wire, or a infinitely narrow coil (as opposed to a typical-size coil). For a coil of practical size, the ratio is actually between 0.6 and 0.7, depending on the coil width.

Note that the arrangement of the magnets in embodiments of FIGS. 13*b* and 13*c* are similar to the arrangement of FIG. 13*a* in that magnets with the same pole orientation form rows and columns that are aligned with the long axes of the X-axis and Y-axis coils of the X- and Y-motor armatures, respectively.

Note that the arrangements of FIGS. 13*b* and 13*c* are arranged such that it is possible to position a thin coil or single wire in a plane of the magnet array where said coil runs over several of the north-oriented magnets Without touching any of south-oriented magnets, with less than 50% of the coil or wire running over an area not occupied by a magnet. This means the averaged peak flux density intercepted by the coil or wire is greater than 50%. The graphs adjacent the plan view of the motor platens of FIGS. 13*a*, 13*b*, and 13*c*, show the variation instantaneous average flux as the coil moves over the platen for a single wire 602 and for a coil of more realistic dimension of about S/4 601 where the spacing between like-oriented magnets is S. As can be seen from the figures, the peak flux for an S/4 wide coil and that for a single wire are the same, about 0.707. The former, however, falls off sooner than the latter as the real coil overlaps opposite poles for a greater proportion of the total displacement. In the diamond-shaped magnet arrays the peak flux for a single wire is 100% but that for a realistic coil of S/4 width is about ⅔.

Figure 14A:
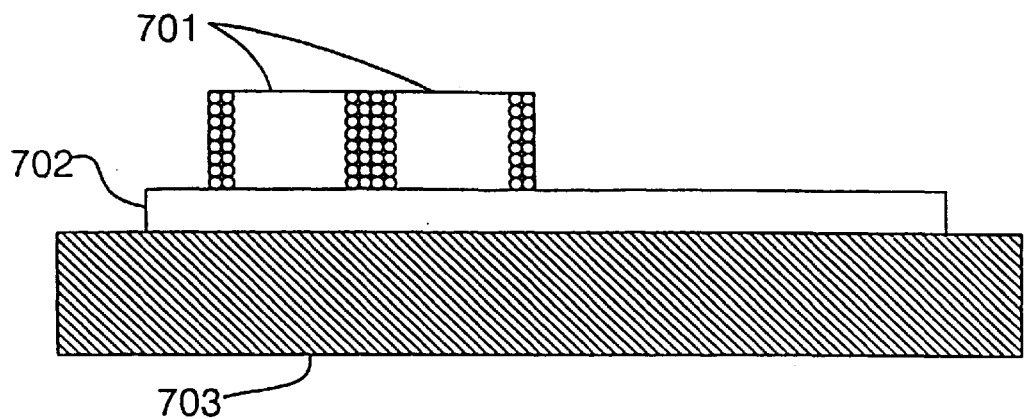
FIGS. 14a, 14b, and 14c are section views of various methods of forming arrays of permanent magnets for the base.
Figure 14B:
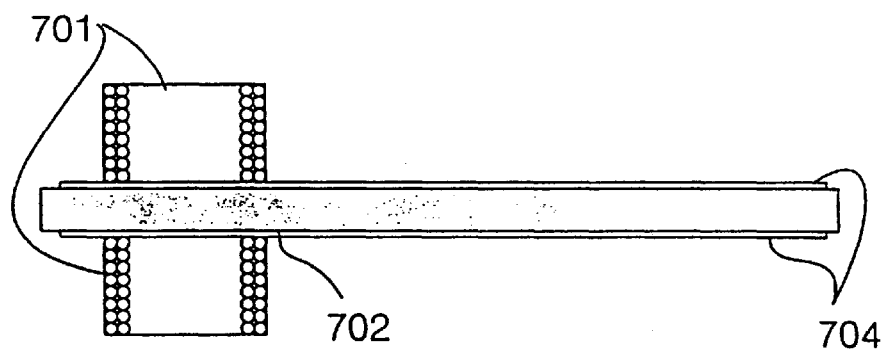
Figure 14C:
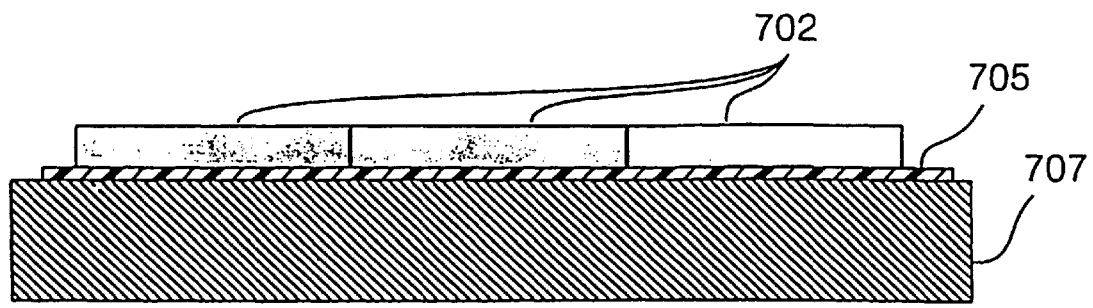

Referring to FIG. 14*a*, to form the magnet array, pieces (for example, sheets) of magnetizable material 702 may be arranged on a base 703 of material characterized by high flux saturation levels. A pair of coils 701 is then pressed against the magnetic material and a current passed through coils 701 to magnetize a region of magnetizable material 702, base 703 closing a magnetic circuit between two coils 701. Coils 701 can then be moved in successive steps over the entire surface of magnetizable material 702 until an array of magnetic regions is formed. Such a method is particularly applicable to form an array such as shown in FIG. 13*b*.

Instead of using a base 703 of high permeability material, alternatively, the magnetizable material can be lined with non-magnetic material 704 and directly pressed from either side by two coils 701 to magnetize magnetizable material 702. Magnetized material 702 is then placed on a cast iron plate or steel plate 707. Due to the high attraction forces. magnetic material 702 can be lowered by a suitable jack, wax 705 being used to support magnetized magnetic material 702 on the surface of plate 707.

Once magnets 702 are in position, wax 705 can be melted away to achieve close contact between the magnets 702 and the base plate 707. Note that although the diamond array of FIG. 13*c* could achieve similar results if the shapes of magnets 301, 302 were changed to a parallelogram shape because diagonals of such parallelogram-shaped magnets would still be perpendicular.

Note that although the embodiments described above relate to planar X-Y traversing systems, the invention applies equally to other types of traversing systems. For example, a traversing system in which a stage moves about a non-planar base could also employ the features described above for the base. Such devices are considered to be within the scope of at least some of the claims.

Note that claims may refer to independent movement in multiple axial directions using terms like orthogonal and perpendicular. It is clear that wherever in the specification movement along mutually perpendicular or orthogonal directions is discussed, such movement can be regarded as characterizing marginal degrees of freedom and therefore encompass any orthogonal coordinate system. For example, the X-direction could be regarded as an angle and the Y-direction as a displacement along the axis of a cylindrical coordinate system. Such variations within the scope of the invention and within the scope of at least some of the claims below. It is also noted here that such terms are not intended to be construed as narrowly as the mathematical sense of orthogonal coordinate systems. For example, a cylindrical coordinate system is not truly an orthogonal coordinate system. However, the present invention is applicable to a system that moves a stage over a cylindrical surface with projection of the X-Y grid on the cylindrical surface. Such a system is disclosed in Applicant's application filed prior to or concurrently with this application (The device is summarized in the next section summarily describing a rotary linear motor). Claims that speak of perpendicular or orthogonal movement are intended to cover movement such as that in such a cylindrical encoder system. In a cylindrical arrangement, magnets would be arranged in a translationally symmetric pattern, just as in the flat platen. The term "translationally symmetric" is used here to characterize any pattern that is achieved by making copies of the sane thing at equal distances from each other. So, for example, a regular pattern of identical tiles forms a translationally symmetric array whether they are laid on a flat surface or a cylindrical surface.

Summary Description of a Rotary-Linear Motor

Briefly, a motor, with two independent degrees of freedom, rotates a stage about an axis and moves the stage along the axis, the range of motion defining a cylinder or cylindrical section. The stage is mounted on a hollow cylindrical plunger fitting in an annular well. The plunger floats on an air-bearing. The plunger has an array of permanent magnets on its external cylindrical face opposite coils in the well. Equal numbers of oppositely-polarized permanent magnets are arranged in a regular cylindrical pattern at 50% packing density forming rings and columns of like-polarity magnets, the rings of one polarity alternating with rings of opposite polarity and the columns of one polarity alternating with columns of opposite polarity. A set of Z-axis coils (for axial movement) curve (the term "curve" being used in its general mathematical sense to encompass straight lines as well is non-straight lines) around the plunger and are shaped to allow a current in them to impel the rings of like-polarized magnets. A set of $\phi$-axis coils (for rotational movement) have longitudinal axes that are parallel the axis of the plunger and are sized to allow current in them to impel the columns of like-polarized magnets. Air is injected into a space between a center column defining the center of the annular well and the internal surface of the plunger to support the plunger. Part of the external surface of the plunger has a grid scale encoded by Z-axis and $\phi$-axis optical pickups to provide position information to a controller.

According to an embodiment of the present invention, there is provided, a rotary-linear motor, comprising: first and second elements, each having a common axis, the first element having at least one magnet, the second element having at least first and second electrical coils capable of generating respective first and second magnetic fields, a bearing to support the first element with respect to the second element to allow the first and second elements to rotate about an axis relative to each other and to slide in a direction collinear with the axis, the first and second coils being positioned relative to each other and relative to the magnet such as to produce a substantial motive force capable of both rotating and displacing the first and second elements with respect to each other when the first and second coils are excited by an electrical current.

According to another embodiment of the present invention, there is provided, a rotary-linear motor, comprising: a base element having one of a plurality of magnets and a plurality of coils, a stage element having the other of a plurality of magnets and a plurality of coils, the stage element being connected to the base element such that the stage element is free to rotate on an axis and slide along the axis, the plurality of magnets and the plurality of coils being arranged to generate a motive force therebetween when the plurality of coils is energized.

According to still another embodiment of the present invention, there is provided, a rotary-linear motor, comprising: a base member, a stage member, the base member having a first cylindrical surface, the stage member having a second cylindrical surface, the first and second cylindrical surfaces having a common axis, the base having one of a plurality of magnets and a plurality of electric coils shaped in such a way as to define a first cylinder coaxial with the common axis and the stage having another of the plurality of magnets and the plurality of electric coils shaped in such a way as to define a second cylinder coaxial with the common axis.

The above rotary-linear motor can employ a multi-axis encoder system, such as described in the present application. The grid scale would be projected on a cylindrical surface and the X- and Y-optical pickups would resolve axial and tangential portions of the curved grid scale.

Although only a few exemplary embodiments of this invention have been described in detail above, those skilled in the art will readily appreciate that many modifications are possible in the exemplary embodiment(s) without materially departing from the novel teachings and advantages of this invention. Accordingly, all such modifications are intended to be included within the scope of this invention as defined in the following claims. In the claims, means-plus-function clauses are intended to cover the structures described herein as performing the recited function and not only structural equivalents but also equivalent structures. Thus although a nail and screw may not be structural equivalents in that a nail relics entirely on friction between a wooden part and a cylindrical surface whereas a screw's helical surface positively engages the wooden part, in the environment of fastening wooden parts, a nail and a screw may be equivalent structures.

What is claimed is:

1. A positioning system, comprising:

a generally planar base having a base surface;

a generally planar cover element overlying said base surface and having a facing surface facing said base surface;

a transparent secondary protective cover sheet overlying said cover element;

said cover element having a non-facing surface on an opposite side of said cover element from said facing surface;

one of said base surface and said facing surface having regions of a first reflectivity with at least one region of a second reflectivity therebetween;

said cover element being generally transparent, whereby said regions of a first reflectivity are visible from said non-facing surface; and said stage having at least one optical pickup oriented to detect a net reflectivity of an area of said of one said base surface and said facing surface.

2. A positioning system as in claim 1, wherein:

said regions of a first reflectivity being arranged in a regular pattern; and said at least one optical pickup having a longitudinal field of detection that is large enough to subtend at least portions of several of said regions.

3. A positioning system as in claim 2 wherein said cover element is of a flexible plastic material.

4. A positioning system as in claim 3 wherein said cover element is of mylar.

5. A positioning system as in claim 3 wherein said cover element is of a material that permits said cover element to remain in position on said base, even if said base is inverted, by natural static electrical attraction or by ambient air pressure.

6. A positioning system as in claim 2, wherein one of said regions of a first reflectivity and said at least one region of a second reflectivity are/is of a metal coating on said cover element, said first reflectivity being an intrinsic property of a metal of said metal coating.

7. A positioning system as in claim 2, wherein:
one of said base and said stage includes at least one magnet; and
another of said base and said stage includes at least one electrical coil, sized and positioned such that when excited, a motive force is generated between said stage and said base.

8. A positioning system as in claim 7, wherein said at least one magnet is of a neodymium-iron composition.

9. A positioning system as in claim 1, wherein said cover element is of a flexible plastic material.

10. A positioning system as in claim 1, wherein:
one of said base and said stage includes at least one magnet; and
another of said base and said stage includes at least one electrical coil, sized and positioned such that when excited, a motive force is generated between said stage and said base.

11. A positioning system as in claim 10, wherein said at least one magnet is of a neodymium-iron composition.

12. A positioning system as in claim 2, wherein:
another of said base surface and said facing surface has regions of a third reflectivity with at least one region of a fourth reflectivity therebetween; and
said regions of a first reflectivity include a series of first linear regions of said first reflectivity;
said regions of a third reflectivity includes a series of second linear regions of said third reflectivity;
said first and second linear regions has respective longitudinal axes;
said longitudinal axes of said first linear regions are mutually parallel; and
said longitudinal axes of said second linear regions are mutually parallel and perpendicular to said longitudinal axes of said first linear regions.

13. A positioning system as in claim 9, wherein said cover element is of mylar.

14. A positioning system as in claim 9, wherein said cover element is of a material that permits said cover element to remain in position on said base, even if said base is inverted, by natural static electrical attraction or by ambient air pressure.

15. A positioning system as in claim 9, wherein one of said regions of a first reflectivity and said at least one region of a second reflectivity are of a metal coating on said cover element, said first reflectivity being an intrinsic property of a metal of said metal coating.

16. A positioning system as in claim 9, wherein:
one of said base and said stage includes at least one magnet; and
another of said base and said stag,e includes at least one electrical coil, sized and positioned such that when excited, a motive force is generated between said stage and said base.

17. A positioning system as in claim 16, wherein said at least one magnet is of a neodymium-iron composition.

18. A positioning system as in claim 9, wherein:
another of said base surface and said facing surface has regions of a third reflectivity with at least one region of a fourth reflectivity therebetween; and
said regions of a first reflectivity includes a series of first linear regions of said first reflectivity;
said regions of a third reflectivity includes a series of second linear regions of said third reflectivity;
said first and second linear regions has respective longitudinal axes;
said longitudinal axes of said first linear regions are mutually parallel; and
said longitudinal axes of said second linear regions are mutually parallel and perpendicular to said longitudinal axes of said first linear regions.

19. A positioning system, comprising:
a generally planar base having a base surface;
a generally planar cover element overlying said base surface and having a facing surface facing said base surface;
said cover element having an exposed surface on an opposite side of said cover element from said facing surface;
one of said base surface and said facing surface having regions of a first reflectivity with at least one region of a second reflectivity therebetween;
said cover element being generally transparent whereby said regions of a first reflectivity are visible from said exposed surface; and
said stage having at least one optical pickup oriented to detect a net reflectivity of an area of said of one said base surface and said facing surface;
wherein one of said regions of a first reflectivity and said at least one region of a second reflectivity are/is of a metal coating on said cover element, said first reflectivity being and intrinsic property of a metal of said metal coating.

20. A positioning system as in claim 19, wherein:
one of said base and said stag,e includes at least one magnet; and
another of said base and said stage includes at least one electrical coil, sized and positioned such that when excited, a motive force is generated between said stage and said base.

21. A positioning system as in claim 20, wherein said at least one magnet is of a neodymium-iron composition.

22. A positioning system as in claim 19, further comprising a transparent secondary protective cover sheet overlying said cover element.

23. A positioning system as in claim 19, wherein:
another of said base surface and said facing surface has regions of a third reflectivity with at least one region of a fourth reflectivity therebetween; and
said regions of a first reflectivity includes a series of first linear regions of said first reflectivity;

said regions of a third reflectivity includes a series of second linear regions of said third reflectivity;

said first and second linear regions has respective longitudinal axes;

said longitudinal axes of said first linear regions are mutually parallel; and said longitudinal axes of said second linear regions are mutually parallel and perpendicular to said longitudinal axes of said first linear regions.

24. A positioning system, comprising:

a generally planar base having a base surface;

a generally planar cover element overlying said base surface and having a facing surface facing said base surface;

said cover element having an exposed surface on an opposite side of said cover element from said facing surface;

one of said base surface and said facing surface having regions of a first reflectivity with at least one region of a second reflectivity therebetween;

said cover element being generally transparent whereby said regions of a first reflectivity are visible from said exposed surface; and said stage having at least one optical pickup oriented to detect a net reflectivity of an area of said of one said base surface and said facing surface;

wherein another of said base surface and said facing surface has regions of a third reflectivity with at least one region of a fourth reflectivity therebetween; and said regions of a first reflectivity includes a series of first linear regions of said first reflectivity;

said regions of a third reflectivity includes a series of second linear regions of said third reflectivity;

said first and second linear regions has respective longitudinal axes;

said longitudinal axes of said first linear regions are mutually parallel; and said longitudinal axes of said second linear regions are mutually parallel and perpendicular to said longitudinal axes of said first linear regions.

25. A positioning system as in claim 24, wherein:

one of said base and said stage includes at least one magnet; and another of said base and said stage includes at least one electrical coil, sized and positioned such that when excited, a motive force is generated between said stage and said base.

26. A positioning system, comprising:

a generally planar base having a base surface;

said base having attached thereto a plurality of magnets forming an array adjacent said base surface;

a stage movably connected to said base;

said stage having an electrical coil positioned sufficiently close to said base surface to generate a motive force by generating a field that interacts with a field generated by said plurality of magnets;

said stage having first and second optical pickups;

a planar cover element between said base and said stage;

an array of regions having a first measurable optical characteristic surrounded by one or more regions having, a second measurable optical characteristic on one of said base and said planar cover element;

said first and second measurable optical characteristics being of a type that can be distinguished by said first and second optical pickups and said first and second optical pickups being positioned and oriented to detect said first and second measurable optical characteristics of respective areas of said one of said base and said planar cover element.

27. A positioning system as in claim 26, wherein said planar cover element is approximately 0.1 inch thick.

28. A positioning system as in claim 27, wherein said plurality of magnets are between 0.3 and 0.6 inch thick in a dimension perpendicular to a plane of said base surface.

29. A positioning system as in claim 27, wherein said electrical coil is part of an armature of a type that has no serrations.

30. A positioning system as in claim 27, wherein said magnets are of neodymium-iron composition.

31. A positioning system as in claim 27, wherein:

said cover element is of glass, approximately 0.04 inch thick, with a cover surface adjacent said base surface; and said cover surface having orthogonal lines forms said array of regions having said first measurable optical characteristic.

32. A positioning system as in claim 27, wherein:

said cover element is of a flexible polymer, less than 0.04 inch thick, with a cover surface adjacent said base surface; and said cover surface having orthogonal lines forms said array of regions having said first measurable optical characteristic.

33. A positioning system as in claim 32, wherein said orthogonal lines are gaps etched from a metalized layer formed on said cover surface.

34. A positioning system as in claim 33, further comprising:

another planar cover element laid over a side of said cover element opposite said base surface; and said another planar element being transparent.

35. A positioning system as in claim 26, wherein said plurality of magnets are between 0.3 and 0.6 inch thick in a dimension perpendicular to a plane of said base surface.

36. A positioning system as in claim 35, wherein said electrical coil is part of an armature of a type that has no serrations.

37. A positioning system as in claim 35 wherein said magnets are of neodymium-iron composition.

38. A positioning system as in claim 35, wherein:

said cover element is of glass approximately 0.04 inch thick, with a cover surface adjacent said base surface; and said cover surface having orthogonal lines forms said array of regions having said first measurable optical characteristic.

39. A positioning system as in claim 35, wherein:

said cover element is of a flexible polymer, less 0.04 inch thick with a cover surface adjacent said base surface; and said cover surface having orthogonal lines forms said array of regions having said first measurable optical characteristic.

40. A positioning system as in claim 39, wherein said orthogonal lines are gaps etched from a metalized layer formed on said cover surface.

41. A positioning system as in claim 40, further comprising:

another planar cover element laid over a side of said cover element opposite said base surface;

said another planar element being transparent.

42. A positioning system as in claim 26, wherein said electrical coil is part of an armature of a type that has no serrations.

43. A positioning, system as in claim 42, wherein said magnets arc of neodymium-iron composition.

44. A positioning system as in claim 42, wherein:
said cover element is of glass, approximately 0.04 inch thick, with a cover surface adjacent said base surface; and
said cover surface having orthogonal lines forms slide array of regions having said first measurable optical characteristic.

45. A positioning system as in claim 26, wherein:
said cover element is of a flexible polymer, less 0.04 inch thick, with a cover surface adjacent said base surface; and
said cover surface having orthogonal lines forms said array of regions having said first measurable optical characteristic.

46. A positioning system as in claim 45, wherein said orthogonal lines are gaps etched from a metalized layer formed on said cover surface.

47. A positioning system as in claim 46, further comprising:
another planar cover element laid over a side of said cover element opposite said base surface;
said another planar element being transparent.

48. A positioning system comprising:
a generally planar base having a base surface;
said base having attached thereto a plurality of magnets forming an array adjacent said surface;
a stage movably connected to said base;
said stage having an electrical coil positioned sufficiently close to said base surface to generate a motive force by generating a field that interacts with a field generated by said plurality of magnets;
said stage having first and second optical pickups;
first and second planar cover elements between said base and said stage;
said first planar cover element having, on a first surface thereof an array of parallel first lines having a first measurable optical characteristic, said first measurable optical characteristic being different from a measurable optical characteristic of spaces between said first lines; and
said second planar cover element having, on a second surface thereof, an array of parallel second lines having a first measurable optical characteristic, said first measurable optical characteristic being, different from a measurable optical characteristic of spaces between said second lines;
said first and second measurable optical characteristics being of a type that can be distinguished by said first and second optical pickups and said first and second optical pickups being positioned and oriented to detect said first and second measurable optical characteristics of respective areas of said one of said base and said planar cover element;
said first and second surfaces facing each other; and
said first lines being perpendicular to said second lines.

49. A positioning system as in claim 48, wherein said planar cover element is approximately 0.1 inch thick.

50. A positioning system as in claim 48, wherein said plurality of magnets are between 0.3 and 0.6 inch thick in a dimension perpendicular to a plane of said base surface.

51. A positioning system as in claim 48, wherein said electrical coil is part of an armature of a type that has no serrations.

52. A positioning system as in claim 48, wherein said magnets are of neodymium-iron composition.

53. A method of making a motor platen for a positioning system, comprising the steps of:
forming a base with an array of magnets embedded therein;
etching a series of parallel lines on a first sheet of transparent material; and
laying said first sheet of transparent material on said base and affixing it thereto.

54. A method as in claim 53, further comprising the steps of:
etching another series of parallel lines on a second sheet of transparent material; and
laying said second sheet adjacent said first.

55. A method of making a motor platen for a positioning system, comprising the steps of:
forming a base with an array of magnets embedded therein;
forming a first array of regions having a first optical property in the form of a first series of parallel lines on a first sheet of transparent material;
forming a second array of second regions having a second optical property in the form of a second series of parallel lines on a second sheet of transparent material; and
laying said first sheet of transparent material on said base and affixing it thereto;
arranging said second sheet so that said first series of parallel lines is perpendicular to said second; and
laying said second sheet on top of said first sheet.

56. A method of making a motor platen for a positioning system comprising the steps of:
laying a generally planar 2-dimensional optical scale element on a flat surface;
forcing said scale element against said flat surface;
arranging magnets on said scale element;
applying a curable resin to said magnets;
laying a base over said curable resin; and
curing said curable resin.

57. A method as in claim 56, wherein said step of forcing includes applying a vacuum between said flat surface and said scale element.

58. A method as in claim 57, wherein said step of applying includes applying epoxy.

59. A method as in claim 57, wherein said step of applying includes applying said curable resin on all surfaces of said magnets including surfaces of said magnets adjacent said scale element.

60. A method as in claim 57, wherein:
said step of arranging includes placing standoffs on said scale element;
said step of arranging includes placing said magnets on said standoffs;
said step of applying includes injecting said resin into a space between said base and said scale element.

61. A method as in claim 56, wherein said step of applying includes applying said curable resin on all surfaces of said magnets including surfaces of said magnets adjacent said scale element.

62. A method as in claim 61, wherein:

said step of arranging includes placing standoffs on said scale element;

said step of arranging includes placing said magnets on said standoffs;

said step of applying includes injecting said resin into a space between said base and said scale element.

63. A method as in claim 56, wherein:

said step of arranging includes placing standoffs on said scale element;

said step of arranging includes placing said magnets on said standoffs;

said step of applying includes injecting said resin into a space between said base and said scale element.

64. A method of making a motor platen for a positioning system comprising the steps of:

laying a generally planar 2-dimensional optical scale element on a flat surface;

forcing said scale element against said flat surface;

arranging magnets on said scale element;

applying a curable resin to said magnets;

laying a base over said curable resin; and curing said curable resin;

said step of arranging including placing standoffs on said scale element;

said step of arranging including placing said magnets on said standoffs; and said step of applying including injecting said resin into a space between said base and said scale element.

* * * * *